United States Patent
Watanabe et al.

(10) Patent No.: US 12,163,249 B2
(45) Date of Patent: Dec. 10, 2024

(54) GROUND SUBSTRATE AND METHOD FOR PRODUCING SAME

(71) Applicant: NGK INSULATORS, LTD., Nagoya (JP)

(72) Inventors: Morimichi Watanabe, Nagoya (JP); Jun Yoshikawa, Nagoya (JP)

(73) Assignee: NGK INSULATORS, LTD., Nagoya (JP)

(*) Notice: Subject to any disclaimer, the term of this patent is extended or adjusted under 35 U.S.C. 154(b) by 566 days.

(21) Appl. No.: 17/467,895

(22) Filed: Sep. 7, 2021

(65) Prior Publication Data

US 2021/0404089 A1    Dec. 30, 2021

Related U.S. Application Data

(63) Continuation of application No. PCT/JP2019/038618, filed on Sep. 30, 2019.

(30) Foreign Application Priority Data

Mar. 28, 2019  (JP) .................................. 2019-063601

(51) Int. Cl.
*C30B 29/40* (2006.01)
*C30B 25/18* (2006.01)
(Continued)

(52) U.S. Cl.
CPC ............ *C30B 29/403* (2013.01); *C30B 25/18* (2013.01); *C30B 29/16* (2013.01);
(Continued)

(58) Field of Classification Search
CPC ..... C30B 29/16; C30B 29/403; C30B 29/406; C30B 1/04; C30B 25/02; C30B 25/18;
(Continued)

(56) References Cited

U.S. PATENT DOCUMENTS

2019/0055667 A1    2/2019   Oshima et al.
2019/0305091 A1*  10/2019   Takahashi .............. H01L 29/78
(Continued)

FOREIGN PATENT DOCUMENTS

JP    2014-072517 A1    4/2014
JP    2014-072533 A1    4/2014
(Continued)

OTHER PUBLICATIONS

International Search Report and Written Opinion (Application No. PCT/JP2019/038618) dated Jan. 7, 2020 (with English translation).
(Continued)

*Primary Examiner* — Jose R Diaz
(74) *Attorney, Agent, or Firm* — BURR PATENT LAW, PLLC

(57) ABSTRACT

Provided is a base substrate including an orientation layer used for crystal growth of a nitride or oxide of a Group 13 element, in which a front surface on a side used for the crystal growth of the orientation layer is composed of a material having a corundum-type crystal structure having an a-axis length and/or c-axis length larger than that of sapphire, the orientation layer contains a material selected from the group consisting of $\alpha\text{-}Cr_2O_3$, $\alpha\text{-}Fe_2O_3$, $\alpha\text{-}Ti_2O_3$, $\alpha\text{-}V_2O_3$, and $\alpha\text{-}Rh_2O_3$, or a solid solution containing two or more selected from the group consisting of $\alpha\text{-}Al_2O_3$, $\alpha\text{-}Cr_2O_3$, $\alpha\text{-}Fe_2O_3$, $\alpha\text{-}Ti_2O_3$, $\alpha\text{-}V_2O_3$, and $\alpha\text{-}Rh_2O_3$, and a half width of an X-ray rocking curve of a (104) plane of the corundum-type crystal structure is 500 arcsec. or less.

20 Claims, 3 Drawing Sheets

(51) Int. Cl.
    *C30B 29/16*     (2006.01)
    *H01L 21/02*     (2006.01)
    *H01L 29/24*     (2006.01)

(52) U.S. Cl.
    CPC .... *H01L 21/0242* (2013.01); *H01L 21/02433* (2013.01); *H01L 21/0254* (2013.01); *H01L 21/02565* (2013.01); *H01L 29/24* (2013.01)

(58) Field of Classification Search
    CPC .................. C30B 25/183; C30B 7/005; H01L 21/02565; H01L 21/02488; H01L 21/0242; H01L 21/02433; H01L 29/24
    See application file for complete search history.

(56) References Cited

U.S. PATENT DOCUMENTS

2021/0355602 A1\* 11/2021 Fukui .................. H01L 21/0242
2021/0404090 A1\* 12/2021 Watanabe ................. C30B 1/04

FOREIGN PATENT DOCUMENTS

JP      2016-025256 A1    2/2016
JP      2019-034883 A1    3/2019

OTHER PUBLICATIONS

Jinno et al., "Reduction in Edge Dislocation Density in Corundum-Structured a-GA$_2$O$_3$ Layers on Sapphire Substrates with Quasi-Graded a-(AL,GA)$_2$O$_3$ Buffer Layers," *The Japan Society of Applied Physics*, Jun. 1, 2016, vol. 9, 071101-1 to 071101-4 (5 pages).

Dang et al., "Growth of a-CR$_2$O$_3$ Single Crystals by Mist CVD Using Ammonium Dichromate," *Applied Physics Express 11*, 111101-1 to 111101-5 (Oct. 15, 2018) (6 pages).

Fujita et al., "Evolution of Corundum-Structured III-Oxide Semiconductors: Growth, Properties, and Devices," *Japanese Journal of Applied Physics*, vol. 55, 1202A3 (2016) (10 pages).

Kaneko et al., "Fabrication by Mist CVD Method and Evaluation of Corundum Structured Oxide Semiconductor Thin Films," *Journal of the Society of Materials Science*, Japan, Sep. 2010, vol. 59, pp. 686-689 (4 pages).

\* cited by examiner

GROUND SUBSTRATE AND METHOD FOR PRODUCING SAME

CROSS-REFERENCE TO RELATED APPLICATIONS

This application is a continuation application of PCT/JP2019/038618 filed Sep. 30, 2019, which claims priority to Japanese Patent Application No. 2019-063601 filed Mar. 28, 2019, the entire contents all of which are incorporated herein by reference.

BACKGROUND OF THE INVENTION

1. Field of the Invention

The present invention relates to a base substrate used for crystal growth of a nitride or oxide of a Group 13 element and a method for producing the same.

2. Description of the Related Art

In recent years, semiconductor devices using gallium nitride (GaN) have been put into practical use. For example, a device in which an n-type GaN layer, a multiple quantum well layer (MQW) in which a quantum well layer composed of an InGaN layer and a barrier layer composed of a GaN layer are alternately stacked, and a p-type GaN layer are sequentially stacked on a sapphire substrate has been mass-produced.

Further, research and development of corundum phase type α-gallium oxide ($\alpha$-$Ga_2O_3$), which has the same crystal structure as sapphire, is being actively carried out. In fact, $\alpha$-$Ga_2O_3$ has a large bandgap of 5.3 eV, and is expected as a material for power semiconductor elements. For example, Patent Literature 1 (JP2014-72533A) discloses an example in which $\alpha$-$Ga_2O_3$ is formed as a semiconductor layer on a sapphire substrate in a semiconductor device formed of a base substrate having a corundum-type crystal structure, a semiconductor layer having a corundum-type crystal structure, and an insulating film having a corundum-type crystal structure. Further, Patent Literature 2 (JP2016-25256A) discloses a semiconductor device including an n-type semiconductor layer containing a crystalline oxide semiconductor having a corundum structure as a main component, a p-type semiconductor layer containing an inorganic compound having a hexagonal crystal structure as a main component, and an electrode, in which a diode is fabricated by forming $\alpha$-$Ga_2O_3$ having a corundum structure which is a metastable phase as an n-type semiconductor layer and an $\alpha$-$Rh_2O_3$ film having a hexagonal crystal structure as a p-type semiconductor layer on a c-plane sapphire substrate in an example.

It is known that, in these semiconductor devices, better characteristics can be obtained when there are fewer crystal defects in the material. In particular, since a power semiconductor is required to have excellent withstand voltage characteristics, it is desirable to reduce crystal defects. This is because the dielectric breakdown electric field characteristics depend on the number of crystal defects. However, in the case of GaN and $\alpha$-$Ga_2O_3$, a single-crystal substrate having few crystal defects has not been put into practical use, and the single crystal substrate is generally formed by heteroepitaxial growth on a sapphire substrate having different lattice constants from those of these materials. Therefore, crystal defects due to the difference in lattice constant with sapphire are likely to occur. For example, in a case where $\alpha$-$Ga_2O_3$ is formed on the c-plane of sapphire, the a-axis length (4.754 Å) of sapphire ($\alpha$-$Al_2O_3$) and the a-axis length (4.983 Å) of $\alpha$-$Ga_2O_3$ differ by about 4.8%, and this difference is the main cause of crystal defects.

It has been reported that defects are reduced by forming a buffer layer between the sapphire and the $\alpha$-$Ga_2O_3$ layer when forming the $\alpha$-$Ga_2O_3$ layer as an approach for reducing crystal defects by reducing the difference in lattice constants between the sapphire and the semiconductor layer. For example, Non-Patent Literature 1 (Applied Physics Express, vol. 9, pages 071101-1 to 071101-4) discloses an example in which edge dislocations and screw dislocations are $3 \times 10^8 / cm^2$ and $6 \times 10^8 / cm^2$, respectively, by introducing a $(Al_x, Ga_{1-x})_2O_3$ layer (x=0.2 to 0.9) as a buffer layer between sapphire and an $\alpha$-$Ga_2O_3$ layer. Further, Non-Patent Literature 2 (Applied Physics Express 11, 111101 (2018)) discloses a substrate in which an $\alpha$-$Cr_2O_3$ film was formed as a buffer layer on sapphire as a substrate for forming an $\alpha$-$Ga_2O_3$ film.

CITATION LIST

Patent Literature

Patent Literature 1: JP2014-72533A
Patent Literature 2: JP2016-25256A

Non-Patent Literature

Non-Patent Literature 1: Riena Jinno et al., Reduction in edge dislocation density in corundum-structured $\alpha$-$Ga_2O_3$ layers on sapphire substrates with quasi-graded $\alpha$-$(Al,Ga)_2O_3$ buffer layers, Applied Physics Express, Japan, The Japan Society of Applied Physics, Jun. 1, 2016, vol. 9, pages 071101-1 to 071101-4

Non-Patent Literature 2: Giang T. Dang et al., Growth of $\alpha$-$Cr_2O_3$ single crystals by mist CVD using ammonium dichromate, Applied Physics Express 11, 111101 (2018)

Non-Patent Literature 3: Shizuo Fujita et al., Evolution of corundum-structured III-oxide semiconductors: Growth, properties, and devices, Japanese Journal of Applied Physics 55, 1202A3 (2016)

SUMMARY OF THE INVENTION

However, the methods of introducing a buffer layer as disclosed in Non-Patent Literature 1 and Non-Patent Literature 2 are insufficient for application to a power semiconductor requiring high dielectric breakdown electric field characteristics, and it is desirable to further reduce crystal defects. Even in a case where $\alpha$-$Cr_2O_3$ as disclosed in Non-Patent Literature 2 is formed as a buffer layer, it is insufficient for application to a power semiconductor requiring high dielectric breakdown electric field characteristics, and it is desirable to further reduce crystal defects. In a case where an $\alpha$-$Cr_2O_3$ film is used as the buffer layer, it is presumed that the reason why crystal defects cannot be sufficiently reduced is that i) there is a lattice mismatch between $\alpha$-$Cr_2O_3$ and $\alpha$-$Ga_2O_3$, and ii) a thin buffer layer is formed on sapphire by heteroepitaxial growth, and therefore large crystal defects are contained in the buffer layer.

In Non-Patent Literature 2, $\alpha$-$Cr_2O_3$ having an a-axis length of 4.961 Å is directly formed on sapphire having an a-axis length of 4.754 Å, and the lattice mismatch reaches 4.3% or more. Therefore, as described above, a large number of crystal defects due to lattice mismatch are generated, and it is considered that the X-ray rocking curve of the (104)

plane of the corundum-type crystal structure has a value significantly higher than the 500 arcsec.

As another example of heteroepitaxial growth in which lattice mismatch is about the same, there is a case where $\alpha$-Ga$_2$O$_3$ is formed on sapphire. Non-Patent Literature 3 (Japanese Journal of Applied Physics 55, 1202A3 (2016)) discloses an example in which an $\alpha$-Ga$_2$O$_3$ film is formed on sapphire using the same mist CVD method as in Non-Patent Literature 2. In Non-Patent Literature 3, the lattice mismatch is about 4.8%, which is almost the same as in Non-Patent Literature 2, but the half width of the X-ray rocking curve of the (104) plane of the corundum-type crystal structure reaches 2000 arcsec., and this suggests that the half width of the X-ray rocking curve of the (104) plane of the corundum-type crystal structure of the film surface becomes a large value in a system having a large lattice mismatch.

The present inventors have now found that an excellent semiconductor layer can be formed by using a base substrate comprising an orientation layer in which a front surface on a side used for crystal growth of a nitride or oxide of a Group 13 element is composed of a material having a predetermined corundum-type crystal structure having an a-axis length and/or c-axis length larger than that of sapphire and a half width of an X-ray rocking curve of a (104) plane of the corundum-type crystal structure on the front surface is 500 arcsec. or less.

Therefore, an object of the present invention is to provide a high-quality base substrate including an orientation layer used for crystal growth of a nitride or oxide of a Group 13 element, in which crystal defects (dislocations) in the orientation layer are significantly reduced. Further, another object of the present invention is to provide a method for producing such a base substrate.

According to an aspect of the present invention, there is provided a base substrate comprising an orientation layer used for crystal growth of a nitride or oxide of a Group 13 element,
  wherein a front surface of the orientation layer on a side used for the crystal growth is composed of a material having a corundum-type crystal structure having an a-axis length and/or c-axis length larger than that of sapphire,
  wherein the orientation layer contains a material selected from the group consisting of $\alpha$-Cr$_2$O$_3$, $\alpha$-Fe$_2$O$_3$, $\alpha$-Ti$_2$O$_3$, $\alpha$-V$_2$O$_3$, and $\alpha$-Rh$_2$O$_3$, or a solid solution containing two or more selected from the group consisting of $\alpha$-Al$_2$O$_3$, $\alpha$-Cr$_2$O$_3$, $\alpha$-Fe$_2$O$_3$, $\alpha$-Ti$_2$O$_3$, $\alpha$-V$_2$O$_3$, and $\alpha$-Rh$_2$O$_3$, and
  wherein a half width of an X-ray rocking curve of a (104) plane of the corundum-type crystal structure on the front surface of the orientation layer on the side used for crystal growth is 500 arcsec. or less.

According to another aspect of the present invention, there is provided a method for producing the base substrate, comprising:
  providing a sapphire substrate;
  forming an orientation precursor layer on a surface of the sapphire substrate, wherein the orientation precursor layer contains a material having a corundum-type crystal structure having an a-axis length and/or c-axis length larger than that of sapphire or a material capable of having a corundum-type crystal structure having an a-axis length and/or c-axis length larger than that of sapphire by heat treatment; and
  heat-treating the sapphire substrate and the orientation precursor layer at a temperature of 1000° C. or greater.

DETAILED DESCRIPTION OF THE INVENTION

Base Substrate

Figure 1:
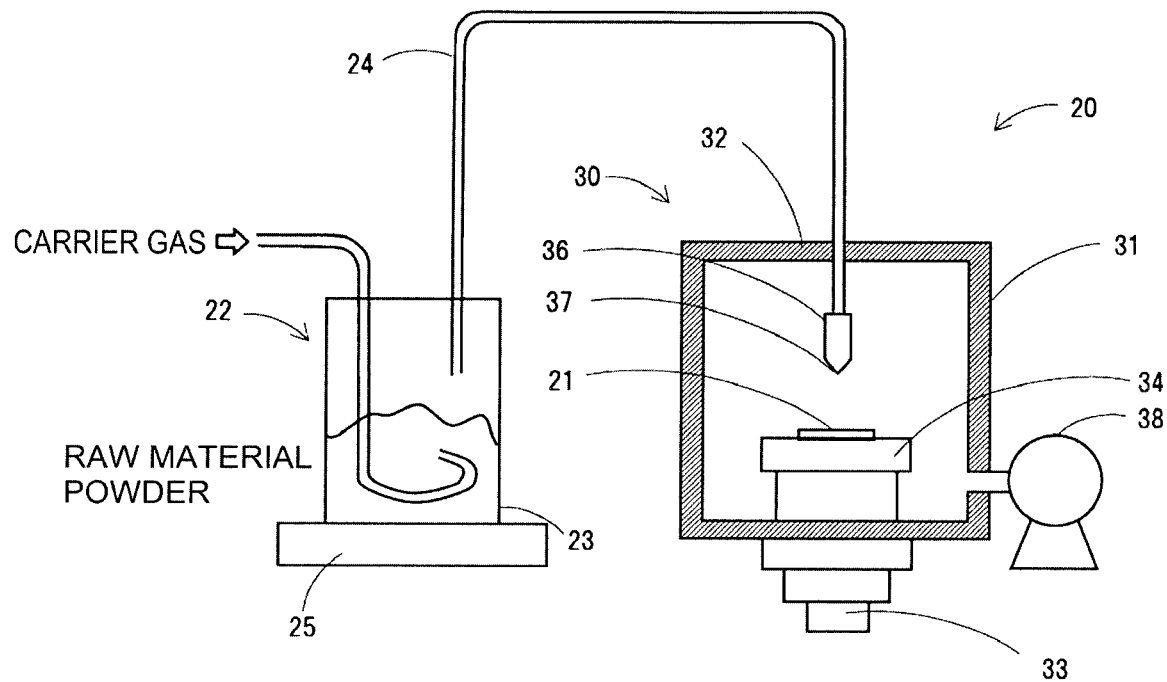
FIG. 1 is a schematic cross-sectional view showing a configuration of an aerosol deposition (AD) apparatus.

A base substrate according to the present invention is a base substrate comprising an orientation layer used for crystal growth of a nitride or oxide of a Group 13 element. That is, this base substrate is used for crystal growth of a semiconductor layer composed of a nitrides or oxide of a Group 13 element on the orientation layer. Here, the term "Group 13 element" refers to a Group 13 element according to the periodic table formulated by the IUPAC (International Union of Pure and Applied Chemistry), and specifically, is any one of boron (B), aluminum (Al), gallium (Ga), indium (In), thallium (Tl), and nihonium (Nh). The nitride and oxide of Group 13 element are typically gallium nitride (GaN) and $\alpha$-gallium oxide ($\alpha$-Ga$_2$O$_3$).

The orientation layer has a structure in which the crystal orientations are substantially aligned in the substantially normal direction. With such a configuration, it is possible to form a semiconductor layer having excellent quality, particularly excellent orientation, on the orientation layer. That is, when the semiconductor layer is formed on the orientation layer, the crystal orientation of the semiconductor layer generally follows the crystal orientation of the orientation layer. Therefore, when the base substrate includes an orientation layer, the semiconductor film can serve as an orientation film. The orientation layer may be a polycrystal, a mosaic crystal (a set of crystals of which crystal orientations are slightly deviated), or a single-crystal. In a case where the orientation layer is polycrystalline, it is preferably a biaxial orientation layer in which the twist direction (that is, the rotation direction about the substrate normal oriented substantially perpendicular to the substrate surface) is also substantially aligned.

The front surface of the orientation layer on the side used for crystal growth (hereinafter, may be simply referred to as "front surface" or "orientation layer front surface") is composed of a material having a corundum-type crystal structure having an a-axis length and/or a c-axis length larger than that of sapphire ($\alpha$-Al$_2$O$_3$). By controlling the lattice constant of the orientation layer in this way, it is possible to significantly reduce the crystal defects in the semiconductor layer formed on the orientation layer. That is, the oxide of the Group 13 elements constituting the semiconductor layer have a lattice constant larger than that of sapphire ($\alpha$-Al$_2$O$_3$). In fact, as shown in Table 1 below, the lattice constant (a-axis length and c-axis length) of $\alpha$-Ga$_2$O$_3$, which is an oxide of Group 13 elements, are larger than the lattice constant of $\alpha$-Al$_2$O$_3$. Therefore, by controlling the lattice constant of the orientation layer to be larger than that of $\alpha$-Al$_2$O$_3$, when the semiconductor layer is formed on the orientation layer, the mismatch of the lattice constant between the semiconductor layer and the orientation layer is decreased, and as a result, crystal defects in the semiconductor layer are reduced. For example, in a case where $\alpha$-$Ga_2O_3$ is formed on the c-plane of sapphire, the lattice length (a-axis length) in the in-plane direction of $\alpha$-$Ga_2O_3$ is larger than that of sapphire, and there is a mismatch of about 4.8%. Therefore, by controlling the a-axis length of the orientation layer to be larger than that of $\alpha$-$Al_2O_3$, crystal defects in the $\alpha$-$Ga_2O_3$ layer can be reduced. In a case where $\alpha$-$Ga_2O_3$ is formed on the m-plane of sapphire, the lattice length (c-axis length and a-axis length) in the in-plane direction of $\alpha$-$Ga_2O_3$ is larger than that of sapphire, and there is a mismatch of about 3.4% in the c-axis length and about 4.8% in the a-axis length. Therefore, by controlling the c-axis length and the a-axis length of the orientation layer to be larger than that of $\alpha$-$Al_2O_3$, crystal defects in the $\alpha$-$Ga_2O_3$ layer can be reduced. Further, GaN, which is a nitride of Group 13 elements, also has a large mismatch between sapphire and lattice constant. In a case where GaN is formed on the c-plane of sapphire, the lattice length (a-axis length) in the in-plane direction of GaN is substantially larger than that of sapphire, and there is a mismatch of about 16.2%. Therefore, by controlling the a-axis length of the orientation layer to be larger than that of $\alpha$-$Al_2O_3$, crystal defects in the GaN layer can be reduced. On the other hand, when these semiconductor layers are formed directly on the sapphire substrate, stress is generated in the semiconductor layer due to the mismatch of lattice constants, and a large amount of crystal defects may be generated in the semiconductor layer.

TABLE 1

Lattice constants of Group 13 oxide

| | a-axis length (Å) | c-axis length (Å) |
|---|---|---|
| $\alpha$-$Ga_2O_3$ | 4.983 | 13.433 |
| $\alpha$-$Al_2O_3$ | 4.754 | 12.990 |
| $\alpha$-$Cr_2O_3$ | 4.961 | 13.599 |
| $\alpha$-$Fe_2O_3$ | 5.038 | 13.772 |
| $\alpha$-$Ti_2O_3$ | 5.157 | 13.610 |
| $\alpha$-$V_2O_3$ | 4.949 | 13.998 |
| $\alpha$-$Rh_2O_3$ | 5.127 | 13.853 |
| $\alpha$-$In_2O_3$ | 5.487 | 14.510 |

It is preferable that the entirety of the orientation layer is composed of a material having a corundum-type crystal structure. By doing so, it is possible to reduce crystal defects in the orientation layer and the semiconductor layer. It is desirable that the orientation layer is formed on the surface of the sapphire substrate. $\alpha$-$Al_2O_3$ constituting the sapphire substrate has a corundum-type crystal structure, and since the orientation layer is composed of a material having a corundum-type crystal structure, the crystal structure can be made the same as that of the sapphire substrate, and as a result, the occurrence of crystal defects in the orientation layer due to crystal structure mismatch is suppressed. In this respect, it is preferable that the crystal defects in the orientation layer are reduced because the crystal defects in the semiconductor layer formed on the orientation layer are also reduced. This is because when a large number of crystal defects are present in the orientation layer, the crystal defects are also taken over to the semiconductor layer formed thereon, and as a result, crystal defects also occur in the semiconductor layer.

The material having a corundum-type crystal structure constituting the orientation layer preferably contains a material selected from the group consisting of $\alpha$-$Cr_2O_3$, $\alpha$-$Fe_2O_3$, $\alpha$-$Ti_2O_3$, $\alpha$-$V_2O_3$, and $\alpha$-$Rh_2O_3$, or a solid solution containing two or more selected from the group consisting of $\alpha$-$Al_2O_3$, $\alpha$-$Cr_2O_3$, $\alpha$-$Fe_2O_3$, $\alpha$-$Ti_2O_3$, $\alpha$-$V_2O_3$, and $\alpha$-$Rh_2O_3$. The base substrate for crystal growth of a semiconductor layer of $\alpha$-$Ga_2O_3$ or an $\alpha$-$Ga_2O_3$ solid solution is particularly preferably composed of a material containing $\alpha$-$Cr_2O_3$ or a material containing a solid solution of $\alpha$-$Cr_2O_3$ and a different material. As shown in Table 1, these materials have lattice constants (a-axis length and/or c-axis length) larger than that of $\alpha$-$Al_2O_3$, and the lattice constants are relatively close to or coincide with those of GaN and $\alpha$-$Ga_2O_3$, which are a nitride and an oxide of Group 13 elements constituting the semiconductor layer, so that crystal defects in the semiconductor layer can be effectively suppressed. The solid solution may be a substitutional solid solution or an interstitial solid solution, but is preferably a substitutional solid solution. Incidentally, the orientation layer is composed of a material having a corundum-type crystal structure, but this does not preclude the inclusion of other trace components.

As described above, the base substrate of the present invention is particularly preferably used for crystal growth of $\alpha$-$Ga_2O_3$ or an $\alpha$-$Ga_2O_3$ solid solution. In this case, an excellent semiconductor layer composed of $\alpha$-$Ga_2O_3$ or an $\alpha$-$Ga_2O_3$ solid solution can be formed by using a base substrate comprising an orientation layer in which the front surface on the side used for film formation may be composed of a material containing at least $\alpha$-$Cr_2O_3$ or a material containing a solid solution of $\alpha$-$Cr_2O_3$ and a different material and the XRC half width of the (104) plane of the corundum-type crystal structure on the front surface is 500 arcsec. or less.

The XRC half width of the (104) plane of the corundum-type crystal structure on the front surface of the orientation layer on the side used for crystal growth of the base substrate of the present invention is 500 arcsec. or less, preferably 150 arcsec. or less, more preferably 100 arcsec. or less, still more preferably 50 arcsec. or less, and particularly preferably 40 arcsec. or less.

As a method for evaluating crystal defects and mosaicism, a method is known in which XRC measurement is performed on the (006) plane and the (104) plane of a corundum-type crystal structure, and evaluation is performed with the half width thereof. In XRC measurement, it is common to correct the warpage of the sample using a vacuum chuck or the like, but it is often difficult to correct the warpage in a case where the amount of warpage is large. Therefore, it can be said that the XRC half width reflects not only crystal defects and mosaicism but also the amount of warpage. In particular, the XRC half width of the (104) plane of the corundum-type crystal structure reflects all of various defects such as threading edge dislocations and threading screw dislocations, mosaicity of regions (domains) having different tilts (inclinations of crystal axes in the growth direction) and twists (rotations of crystal axes in the surface plane), and the state of warpage, and therefore, the XRC half width is suitable as a method for evaluating the quality of an orientation layer. Therefore, when the XRC half width is within the above range, the orientation layer has few crystal defects, small mosaicity (few domains), and small warpage, and as a result, in a case where an $\alpha$-$Ga_2O_3$ based semiconductor film is formed on such an orientation layer, crystal defects and mosaicity do not propagate inside the semiconductor film, and a high-quality semiconductor film with small warpage can be obtained. As described above, the XRC half width of the (104) plane of the corundum-type crystal structure in the orientation layer is preferably as small as possible, and although there is no problem even if the value is equivalent to the half width specific to the X-ray source used for measurement, 30 arcsec. or more is actually preferable.

The measurement of the XRC profile of the (104) plane of the corundum-type crystal structure on the front surface of the orientation layer on the side used for crystal growth can be performed using a general XRD apparatus. For example, when D8-DISCOVER manufactured by Bruker-AXS is used as the XRD apparatus, $2\theta$, $\omega$, $\chi$, and $\varphi$ may be adjusted to perform axial alignment so that the peak of the (104) plane of the corundum-type crystal structure appears, and then measurement may be performed by under conditions of a tube voltage of 40 kV, a tube current of 40 mA, an anti-scattering slit of 3 mm, in a range of an $\omega$=15.5 to 19.5°, an $\omega$ step width of 0.005°, and a counting time of 0.5 seconds. This measurement is preferably performed after converting CuK$\alpha$ rays into parallel monochromatic light with a Ge (022) asymmetric reflection monochromator. The half width in the XRC profile of the (104) plane of the corundum-type crystal structure can be determined by performing peak search after profile smoothing using XRD analysis software ("LEPTOS" Ver 4.03, manufactured by Bruker-AXS).

Further, the XRC half width of the (006) plane of the corundum-type crystal structure on the front surface of the orientation layer on the side used for crystal growth is desirably small, preferably 100 arcsec. or less, more preferably 50 arcsec. or less, and still more preferably 40 arcsec. or less. There is no problem even if the XRC half width of the (006) plane is equivalent to the half width specific to the X-ray source used for measurement, 30 arcsec. or more is actually preferable. The XRC half width of the (006) plane of the corundum-type crystal structure reflects information on threading screw dislocations, tilts and warpages, and domains. Therefore, when the XRC half width is within the above range, there are few crystal defects, small mosaicity (few domains), and small warpage, and as a result, in a case where a semiconductor film is formed on such an orientation layer, crystal defects and domains do not propagate inside the semiconductor film, and a higher-quality semiconductor film can be obtained.

The measurement of the XRC profile of the (006) plane of the corundum-type crystal structure with respect to the front surface of the orientation layer on the side used for crystal growth can also be performed using a general XRD apparatus. For example, the measurement conditions in the case of using D8-DISCOVER manufactured by Bruker-AXS as the XRD apparatus can be the same as the conditions described above for the (104) plane except that $2\theta$, $\omega$, $\chi$, and $\varphi$ are adjusted to perform axial alignment so that the peak of the (006) plane of the corundum-type crystal structure appears, and then w is set to 18.0 to 22.0°.

In the base substrate of the present invention, the crystal defect density on the front surface of the orientation layer on the side used for crystal growth is preferably $1.0 \times 10^6/cm^2$ or less, more preferably $1.0 \times 10^5/cm^2$ or less, still more preferably $4.0 \times 10^3/cm^2$ or less, and particularly preferably $1.0 \times 10^3/cm^2$ or less. In the case of such a film formation surface having extremely low crystal defect density, crystal defects do not propagate into the $\alpha$-Ga$_2$O$_3$ based semiconductor film formed thereon, and a high-quality semiconductor film having excellent dielectric breakdown electric field characteristics can be obtained. The lower limit of the crystal defect density is not particularly limited and is preferably low. In the present specification, the crystal defects refer to threading edge dislocations, threading screw dislocations, threading mixed dislocations, and basal plane dislocations, and the crystal defect density is the total of the dislocation densities. The basal plane dislocation is a problem in a case where the semiconductor film has an off-angle, and is not a problem because the surface of the semiconductor film is not exposed in a case where there is no off-angle. For example, when the threading edge dislocations are $3 \times 10^4/cm^2$, the threading screw dislocations are $6 \times 10^4/cm^2$, and the threading mixed dislocations are $4 \times 10^4/cm^2$, the crystal defect density becomes $1.3 \times 10^5/cm^2$.

The crystal defect density of the front surface of the orientation layer on the side used for crystal growth can be evaluated by plane TEM observation (plan view). When performing plane TEM observation, it can be performed using a general transmission electron microscope. For example, in a case where H-90001UHR-I manufactured by Hitachi is used as the transmission electron microscope, TEM observation may be performed at an acceleration voltage of 300 kV. The test piece used for TEM observation may be cut out so as to include the front surface of the orientation layer on the side used for crystal growth, and processed by ion milling so that the region of the measurement field of 4.1 μm×3.1 μm can be observed at eight or more places and the thickness around the measurement field is 150 nm. The crystal defect density can be evaluated from the plane TEM image of the surface of the test piece thus obtained.

Although the c-plane of the corundum-type crystal structure is three-fold symmetric, a rotation domain rotated by 60° around the c-axis as the rotation axis is likely to be generated. In a case where such a rotating domain is present in the corundum-type crystal on the surface of the base substrate, the rotation domain is inherited by the semiconductor film formed thereon, which may deteriorate the quality of the semiconductor film. In the base substrate of the present invention, when an X-ray diffraction (XRD) $\varphi$ scan measurement is performed on the (104) plane of the corundum-type crystal structure on the front surface of the orientation layer on the side used for crystal growth, a proportion of a peak intensity of a sub-peak caused by a rotation domain to a peak intensity of a main peak is preferably 5.00% or less, more preferably 1.00% or less, and still more preferably 0.50% or less. Since it is preferable that the number of rotation domains is small, the lower limit value of the proportion of the peak intensity of the sub-peak caused by the rotation domains is not particularly limited, and is ideally 0%. By controlling the crystal state of the orientation layer on the surface of the base substrate in this way, in a case where a semiconductor film is formed on the orientation layer, a rotation domain is less likely to be generated in the semiconductor film, and a higher quality semiconductor film can be obtained.

The a-axis length of the material having a corundum-type crystal structure on the front surface of the orientation layer on the side used for crystal growth is larger than 4.754 Å and 5.157 Å or less, and more preferably 4.850 to 5.000 Å. It is still more preferably 4.900 to 5.000 Å. The c-axis length of the material having a corundum-type crystal structure on the front surface of the orientation layer on the side used for crystal growth is larger than 12.990 Å and 13.998 Å or less, and more preferably 13.000 to 13.800 Å. It is still more preferably 13.400 to 13.600 Å. By controlling within such a range, the a-axis length and/or the c-axis length of the front surface of the orientation layer can be close to the lattice constant (a-axis length and/or c-axis length) of the nitride or oxide of Group 13 element constituting the semiconductor layer, in particular, $\alpha$-Ga$_2$O$_3$.

The thickness of the orientation layer is preferably 10 μm or more, and more preferably 40 μm or more. The upper limit of the thickness is not particularly limited, but is typically 1000 μm or less. In a case where the orientation layer is used as a stand-alone substrate, the thickness of the orientation layer may be even greater from the viewpoint of handleability, and the thickness may be, for example, 1 mm or more, and from the viewpoint of cost, the thickness may be, for example, 2 mm or less. The crystal defects on the front surface of the orientation layer can also be reduced by increasing the thickness of the orientation layer. When the orientation layer is formed on the sapphire substrate, the lattice constant of the sapphire substrate is slightly different from that of the orientation layer, and as a result, crystal defects are likely to occur at the interface between the sapphire substrate and the orientation layer, that is, in the lower portion of the orientation layer. However, by increasing the thickness of the orientation layer, it is possible to reduce the influence of such crystal defects generated in the lower portion of the orientation layer on the front surface of the orientation layer. The reason for this is not clear, but it is considered that the crystal defects generated in the lower portion of the orientation layer do not reach the front surface of the thick orientation layer and disappear. In addition, by increasing the thickness of the orientation layer, it is expected that the semiconductor layer can be separated after the semiconductor layer is formed over the orientation layer, and the base substrate can be reused.

In a case where the orientation layer is formed on a sapphire substrate, a gradient composition region having a composition varying in a thickness direction is preferably present in the orientation layer. For example, the gradient composition region preferably includes a region which is composed of a solid solution of one or more materials selected from the group consisting of α-$Cr_2O_3$, α-$Fe_2O_3$, α-$Ti_2O_3$, α-$V_2O_3$, and α-$Rh_2O_3$, and α-$Al_2O_3$, and has a gradient composition in which the solid solution amount of α-$Al_2O_3$ decreases from the sapphire substrate side toward the orientation layer front surface side. The gradient composition region is preferably composed of a solid solution containing α-$Al_2O_3$ and α-$Cr_2O_3$, and particularly preferably composed of a solid solution containing α-$Al_2O_3$, α-$Cr_2O_3$, and α-$Ti_2O_3$, or a solid solution containing α-$Al_2O_3$, α-$Cr_2O_3$, α-$Ti_2O_3$, and α-$Fe_2O_3$. That is, it is desirable that the orientation layer is formed on the surface of the sapphire substrate, but stress due to a difference in lattice constant (a-axis length and/or c-axis length) between the sapphire substrate and the orientation layer is relaxed, and there is an effect of suppressing generation of crystal defects. In other words, it is preferable that the a-axis length and/or c-axis length is different between the front surface and the rear surface of the orientation layer, and it is preferable that the front surface has a larger a-axis length and/or c-axis length than the rear surface of the orientation layer. Specifically, the value of the a-axis length and/or the c-axis length of the orientation layer on the front surface of the orientation layer on the side used for crystal growth is preferably larger than the value of the a-axis length and/or the c-axis length on the rear surface of the orientation layer by 4.0% or more (the upper limit of this value is not particularly limited, but is typically 15.4% or less). With such a structure, the lattice constant varies in the thickness direction even though the orientation layer is a single-crystal, a mosaic crystal, or a biaxial orientation layer. Therefore, a single-crystal, a mosaic crystal, or a biaxially orientation layer can be formed on substrates having different lattice constants in a state where the stress is relaxed.

Such a gradient composition region can be formed by heat-treating the sapphire substrate and the orientation precursor layer at a temperature of 1000° C. or greater in the production of the base substrate described later. That is, when heat treatment is performed at such a high temperature, a reaction occurs at the interface between the sapphire substrate and the orientation precursor layer, and the Al component in the sapphire substrate diffuses into the orientation precursor layer, and the component in the orientation precursor layer diffuses into the sapphire substrate. As a result, a gradient composition region is formed in which the solid solution amount of α-$Al_2O_3$ varies in the thickness direction. The thicker the gradient composition region, the easier it is to relax the stress caused by the difference in lattice constants, so the thicker the composition region, the better. Therefore, the thickness of the gradient composition region is preferably 5 μm or more, more preferably 20 μm or more. The upper limit of the thickness is not particularly limited, but is typically 100 μm or less. Further, by performing the heat treatment at 1000° C. or greater, the crystal defects reaching the front surface of the orientation layer can be effectively reduced. The reason for this is not clear, but it is considered that heat treatment at high temperature promotes annihilation of crystal defects.

According to a more preferred embodiment of the present invention, the orientation layer has a composition stable region located near the front surface and having a composition stable in a thickness direction, and a gradient composition region located far from the front surface and having a composition varying in the thickness direction. The composition stable region is a region in which the change in the content ratio of each metal element is less than 1.0 at %, and the gradient composition region is a region in which the change in the content ratio of each metal element is 1.0 at % or more. For example, the composition stable region and the gradient composition region can be determined as follows. First, a cross-sectional sample of the orientation layer is provided, and an energy dispersive X-ray analysis (EDS) is performed at any ten locations in the vicinity of the front surface of the orientation layer, and an average value of the content ratio (at %) of the detected metal element is calculated. Next, EDS analysis is performed at arbitrary ten points apart from the front surface by 2 μm in the thickness direction, and the average value of the content ratio (at %) at the 2 μm thickness point is calculated. At this time, the average value of the content ratio between the front surface and the point of 2 μm thickness is compared, and the difference in the content ratio of at least one kind of metal element among all detected metal elements is less than 1.0 at % or 1.0 at % or more, and can be assigned to either the composition stable region or the gradient composition region for the region from the front surface to 2 μm thickness. Similarly, by calculating the average value of the content ratio of the metal element for every 2 μm in the thickness direction and comparing the average value of the content ratio of the metal element between a certain thickness point and a point separated by 2 μm in the thickness direction, it is possible to determine the assignment of the region between the points. For example, the region between the point having a thickness of 24 μm and the point having a thickness of 26 μm from the front surface can be assigned by calculating the average value of the metal element content ratio at each point and comparing them. For example, in a case where the orientation layer contains Al, it is more preferable that the Al concentration in the gradient composition region decreases in the thickness direction toward the composition stable region. In this embodiment, the material having a corundum-type crystal structure is preferably a material containing one or more materials selected from the group consisting of $\alpha$-$Cr_2O_3$, $\alpha$-$Fe_2O_3$, and $\alpha$-$Ti_2O_3$ or solid solutions thereof, or a solid solution containing $\alpha$-$Al_2O_3$ and one or more materials selected from the group consisting of $\alpha$-$Cr_2O_3$, $\alpha$-$Fe_2O_3$, and $\alpha$-$Ti_2O_3$. Particularly preferably, the gradient composition region is composed of a solid solution containing $\alpha$-$Cr_2O_3$ and $\alpha$-$Al_2O_3$. The composition stable region may be a material having a lattice constant (a-axis length and/or c-axis length) larger than that of $\alpha$-$Al_2O_3$, may be a solid solution containing a plurality of corundum-type materials, or may be a corundum-type material single phase. That is, the material constituting the composition stable region is preferably (i) one material selected from the group consisting of $\alpha$-$Cr_2O_3$, $\alpha$-$Fe_2O_3$, $\alpha$-$Ti_2O_3$, $\alpha$-$V_2O_3$, and $\alpha$-$Rh_2O_3$, or (ii) a solid solution containing one or more materials selected from the group consisting of $\alpha$-$Cr_2O_3$, a-$Fe_2O_3$, $\alpha$-$Ti_2O_3$, $\alpha$-$V_2O_3$, and $\alpha$-$Rh_2O_3$, or (iii) a solid solution of one or more materials selected from the group consisting of $\alpha$-$Cr_2O_3$, $\alpha$-$Fe_2O_3$, $\alpha$-$Ti_2O_3$, $\alpha$-$V_2O_3$, and $\alpha$-$Rh_2O_3$, and $\alpha$-$Al_2O_3$. From the viewpoint of controlling the lattice constant, it is preferable that the material is composed of a single phase containing no $\alpha$-$Al_2O_3$ or a solid solution thereof.

The orientation of the material constituting the orientation layer is not particularly limited as long as it has an orientation property with respect to the surface of the base substrate, and is, for example, c-axis orientation, a-axis orientation, or m-axis orientation. By doing so, when the semiconductor layer is formed on the base substrate, the semiconductor film can be oriented in the c-axis orientation film, the a-axis orientation film, or the m-axis orientation film.

The orientation layer is preferably a heteroepitaxial growth layer. For example, in a case where the orientation layer is grown on the sapphire substrate, since both the sapphire substrate and the orientation layer have a corundum-type crystal structure, epitaxial growth in which the crystal plane of the orientation layer is arranged according to the crystal orientation of the sapphire substrate may occur during the heat treatment in a case where the lattice constants of the sapphire substrate and the orientation layer are close to each other. By epitaxially growing the orientation layer in this way, the orientation layer can inherit the high crystallinity and crystal orientation peculiar to the single-crystal of the sapphire substrate.

The arithmetic mean roughness Ra on the front surface of the orientation layer is preferably 1 nm or less, more preferably 0.5 nm or less, and still more preferably 0.2 nm or less. It is considered that the crystallinity of the semiconductor layer provided thereon is further improved by smoothing the front surface of the orientation layer in this way.

The base substrate has an area of preferably 20 $cm^2$ or more, more preferably 70 $cm^2$ or more, and still more preferably 170 $cm^2$ or more on one side thereof. By increasing the area of the base substrate in this way, it is possible to increase the area of the semiconductor layer formed on the substrate. Therefore, it is possible to obtain a large number of semiconductor elements from one semiconductor layer, and further reduction in production cost is expected. The upper limit of the size is not particularly limited, but is typically 700 $cm^2$ or less on one side.

The base substrate of the present invention preferably further includes a support substrate on the side opposite to the front surface (that is, the rear surface side) of the orientation layer. That is, the base substrate of the present invention may be a base substrate including a support substrate and an orientation layer provided on the support substrate. The support substrate is preferably a sapphire substrate or a corundum single-crystal such as $Cr_2O_3$, and particularly preferably a sapphire substrate. By using a corundum single-crystal as the support substrate, the orientation layer can also serve as a seed crystal for heteroepitaxial growth. Further, by forming the structure including the corundum single-crystal as described above, a semiconductor layer having excellent quality can be obtained. That is, the corundum single-crystal has characteristics such as excellent mechanical properties, thermal properties, and chemical stability. In particular, sapphire has a high thermal conductivity of 42 W/m·K at room temperature and is excellent in thermal conductivity. Therefore, by using a base substrate including a sapphire substrate, the thermal conductivity of the entire substrate can be improved. As a result, when the semiconductor layer is formed on the base substrate, it is expected that the temperature distribution in the substrate surface is prevented from becoming non-uniform, and the semiconductor layer having a uniform film thickness can be obtained. Further, a sapphire substrate having a large area is easily available, so that the overall cost can be reduced and a semiconductor layer having a large area can be obtained.

The sapphire substrate used as the support substrate may have any orientation plane. That is, the sapphire substrate may have an $\alpha$-plane, a c-plane, an r-plane, or an m-plane, or may have a predetermined off-angle with respect to these planes. Further, sapphire to which a dopant is added may be used in order to adjust the electrical characteristics. As such a dopant, a known dopant can be used.

A semiconductor layer composed of a nitride or oxide of Group 13 element can be formed using the orientation layer of the base substrate according to the present invention. The semiconductor layer can be formed by a known method, but is preferably formed by any of vapor phase film forming methods such as various CVD methods, an HVPE method, a sublimation method, an MBE method, a PLD method, and a sputtering method, and liquid phase film forming methods such as a hydrothermal method and an Na flux method. Examples of the CVD method include a thermal CVD method, a plasma CVD method, a mist CVD method, and an MO (metal organic) CVD method. Among these, the mist CVD method, the hydrothermal method, or the HVPE method is particularly preferable for forming the semiconductor layer composed of the oxide of Group 13 element.

The base substrate of the present invention may be in the form of a self-standing substrate having an orientation layer alone, or may be in the form of a base substrate with a support substrate such as a sapphire substrate. Therefore, if desired, the orientation layer may ultimately be separated from the support substrate, such as a sapphire substrate. The separation of the support substrate may be performed by a known method and is not particularly limited. Examples thereof include a method of separating an orientation layer by applying mechanical impact, a method of separating an orientation layer by applying heat and utilizing thermal stress, a method of separating an orientation layer by applying vibration such as ultrasonic waves, a method of separating an orientation layer by etching an unnecessary portion, a method of separating an orientation layer by laser lift-off, and a method of separating an orientation layer by mechanical processing such as cutting or polishing. Further, in the case of heteroepitaxially growing the orientation layer on the sapphire substrate, the orientation layer may be installed on another support substrate after the sapphire substrate is separated. The material of the other support substrate is not particularly limited, but a suitable material may be selected from the viewpoint of material properties. For example, from the viewpoint of thermal conductivity, a metal substrate or a substrate made of Cu or the like, a ceramic substrate made of SiC, AlN or the like, or the like may be used.

Production Method

The base substrate of the present invention can be preferably produced by (a) providing a sapphire substrate, (b) preparing a predetermined orientation precursor layer, (c) performing heat treatment on the orientation precursor layer on the sapphire substrate to convert at least a portion near the sapphire substrate into an orientation layer, and optionally (d) subjecting the orientation layer to processing such as grinding or polishing to expose the surface of the orientation layer. This orientation precursor layer becomes an orientation layer by heat treatment and contains a material having a corundum-type crystal structure having an a-axis length and/or c-axis length larger than that of sapphire or a material capable of having a corundum-type crystal structure having an a-axis length and/or c-axis length larger than that of sapphire by heat treatment to be described later. Further, the orientation precursor layer may contain trace components in addition to the material having a corundum-type crystal structure. According to such a production method, the growth of the orientation layer can be promoted by using the sapphire substrate as a seed crystal. That is, the high crystallinity and crystal orientation peculiar to the single-crystal of the sapphire substrate are inherited by the orientation layer.

(a) Provision of Sapphire Substrate

To prepare a base substrate, first, a sapphire substrate is provided. The sapphire substrate used may have any orientation plane. That is, the sapphire substrate may have an α-plane, a c-plane, an r-plane, or an m-plane, or may have a predetermined off-angle with respect to these planes. For example, in a case where a c-plane sapphire is used, since the c-axis is oriented with respect to the surface, it is possible to easily heteroepitaxially grow a c-axis oriented orientation layer thereon. A sapphire substrate to which a dopant is added may also be used to adjust electrical properties. As such a dopant, a known dopant can be used.

(b) Preparation of Orientation Precursor Layer

An orientation precursor layer containing a material having a corundum-type crystal structure having an a-axis length and/or c-axis length larger than that of sapphire or a material capable of having a corundum-type crystal structure having an a-axis length and/or c-axis length larger than that of sapphire by heat treatment is prepared. The method for forming the orientation precursor layer is not particularly limited, and a known method can be adopted. Examples of the method for forming the orientation precursor layer include an aerosol deposition (AD) method, a sol-gel method, a hydrothermal method, a sputtering method, an evaporation method, various chemical vapor deposition (CVD) methods, an HVPE method, a PLD method, a chemical vapor transport (CVT) method, and a sublimation method. Examples of the CVD method include a thermal CVD method, a plasma CVD method, a mist CVD method, and an MO (metal organic) CVD method. Alternatively, a method may be used in which a molded body of the orientation precursor is prepared in advance and the molded body is placed on a sapphire substrate. Such a molded body can be produced by molding the material of the orientation precursor by a method such as tape casting or press molding. Further, it is also possible to use a method in which a polycrystal prepared in advance by various CVD methods, sintering, or the like is used as the orientation precursor layer and is placed on a sapphire substrate.

However, aerosol deposition (AD) methods, various CVD methods, or sputtering methods are preferred. By using these methods, a dense orientation precursor layer can be formed in a relatively short time, and heteroepitaxial growth using a sapphire substrate as a seed crystal can be easily caused. In particular, the AD method does not require a high vacuum process and has a relatively high film formation rate, and is therefore preferable in terms of production cost. In the case of using a sputtering method, a film can be formed using a target of the same material as that of the orientation precursor layer, but a reactive sputtering method in which a film is formed in an oxygen atmosphere using a metal target can also be used. A method of placing a molded body prepared in advance on sapphire is also preferable as a simple method, but since the orientation precursor layer is not dense, a process of densification is required in the heat treatment step described later. In the method of using a polycrystalline prepared in advance as an orientation precursor layer, two steps of a step of preparing a polycrystalline body and a step of performing heat treatment on a sapphire substrate are required. Further, in order to improve the adhesion between the polycrystal and the sapphire substrate, it is necessary to take measures such as keeping the surface of the polycrystal sufficiently smooth. Although known conditions can be used for any of the methods, a method of directly forming an orientation precursor layer using an AD method and a method of placing a molded body prepared in advance on a sapphire substrate will be described below.

The AD method is a technique for forming a film by mixing fine particles or a fine particle raw material with a gas to form an aerosol, and impacting the aerosol on a substrate by injecting the aerosol at a high speed from a nozzle, and has a feature of forming a film densified at ordinary temperature. FIG. 1 shows an example of a film forming apparatus (aerosol deposition (AD) apparatus) used in such an AD method. The film forming apparatus 20 shown in FIG. 1 is configured as an apparatus used in an AD method in which a raw material powder is injected onto a substrate in an atmosphere having a pressure lower than atmospheric pressure. The film forming apparatus 20 includes an aerosol generating unit 22 that generates an aerosol of raw material powder containing raw material components, and a film forming unit 30 that forms a film containing the raw material components by injecting the raw material powder onto the sapphire substrate 21. The aerosol generating unit 22 includes an aerosol generation chamber 23 that stores raw material powder and receives a carrier gas supply from a gas cylinder (not shown) to generate an aerosol, and a raw material supply pipe 24 that supplies the generated aerosol to the film forming unit 30, and a vibrator 25 that applies vibration at frequencies of 10 to 100 Hz to the aerosol generating chamber 23 and the aerosol therein. The film forming unit 30 has a film forming chamber 32 that injects aerosols onto the sapphire substrate 21, a substrate holder 34 that is disposed inside the film forming chamber 32 and fixes the sapphire substrate 21, and an X-Y stage 33 that moves the substrate holder 34 in the X-Y axis direction. Further, the film forming unit 30 includes an injection nozzle 36 in which a slit 37 is formed at a tip thereof to inject aerosol into the sapphire substrate 21, and a vacuum pump 38 for reducing the pressure in the film forming chamber 32.

It is known that the AD method can control a film thickness, a film quality, and the like according to film forming conditions. For example, the form of the AD film is easily affected by the collision rate of the raw material powder to the substrate, the particle size of the raw material powder, the aggregated state of the raw material powder in the aerosol, the injection amount per unit time, and the like. The collision rate of the raw material powder with the substrate is affected by the differential pressure between the film forming chamber 32 and the injection nozzle 36, the opening area of the injection nozzle, and the like. If appropriate conditions are not used, the coating may become a green compact or generate pores, so it is necessary to appropriately control these factors.

In a case where a molded body in which the orientation precursor layer is prepared in advance is used, the raw material powder of the orientation precursor can be molded to prepare the molded body. For example, in a case where press molding is used, the orientation precursor layer is a press molded body. The press molded body can be prepared by press-molding the raw material powder of the orientation precursor based on a known method, and may be prepared, for example, by placing the raw material powder in a mold and pressing the raw material powder at pressures of preferably 100 to 400 kgf/cm$^2$, and more preferably 150 to 300 kgf/cm$^2$. The molding method is not particularly limited, and in addition to press molding, tape casting, slip casting, extrusion molding, doctor blade method, and any combination thereof can be used. For example, in the case of using tape casting, it is preferable that additives such as a binder, a plasticizer, a dispersant, and a dispersion medium are appropriately added to the raw material powder to form a slurry, and the slurry is discharged and molded into a sheet shape by passing through a slit-shaped thin discharge port. The thickness of the molded body formed into a sheet is not limited, but is preferably 5 to 500 μm from the viewpoint of handling. Further, in a case where a thick orientation precursor layer is required, a large number of these sheet molded bodies may be stacked and used as a desired thickness.

In these molded bodies, the portion near the sapphire substrate becomes an orientation layer by the subsequent heat treatment on the sapphire substrate. As described above, in such a method, it is necessary to sinter and densify the molded body in the heat treatment step described later. Therefore, the molded body may contain trace components such as a sintering aid in addition to the material having or resulting in a corundum-type crystal structure.

(c) Heat Treatment of Orientation Precursor Layer on Sapphire Substrate

A heat treatment is performed on the sapphire substrate on which the orientation precursor layer is formed at a temperature of 1000° C. or greater. By this heat treatment, at least a portion of the orientation precursor layer near the sapphire substrate can be converted into a dense orientation layer. Further, this heat treatment enables heteroepitaxial growth of the orientation layer. That is, by forming the orientation layer with a material having a corundum-type crystal structure, heteroepitaxial growth occurs in which the material having a corundum-type crystal structure crystal grows using a sapphire substrate as a seed crystal during heat treatment. At that time, the crystals are rearranged, and the crystals are arranged according to the crystal plane of the sapphire substrate. As a result, the crystal axes of the sapphire substrate and the orientation layer can be aligned. For example, when a c-plane sapphire substrate is used, both the sapphire substrate and the orientation layer can be c-axis oriented with respect to the surface of the base substrate. Moreover, this heat treatment makes it possible to form a gradient composition region in a part of the orientation layer.

That is, during the heat treatment, a reaction occurs at the interface between the sapphire substrate and the orientation precursor layer, and the Al component in the sapphire substrate diffuses into the orientation precursor layer, and/or the component in the orientation precursor layer diffuses into the sapphire substrate, thereby forming a gradient composition region composed of a solid solution containing α-Al$_2$O$_3$.

It is known that methods such as various CVD methods, a sputtering method, an HVPE method, a PLD method, a CVT method, and a sublimation method may cause heteroepitaxial growth on a sapphire substrate without heat treatment at 1000° C. or greater. However, it is preferable that the orientation precursor layer is in a non-oriented state, that is, amorphous or non-oriented polycrystalline, at the time of preparation thereof, and the crystal rearrangement is caused by using sapphire as a seed crystal at the time of the heat treatment step. By doing so, it is possible to effectively reduce the crystal defects that reach the front surface of the orientation layer. The reason for this is not clear, but it is considered that the crystal defects generated in the lower portion of the orientation layer are likely to be annihilated.

The heat treatment is not particularly limited as long as a corundum-type crystal structure is obtained and heteroepitaxial growth using a sapphire substrate as a seed occurs, and can be performed in a known heat treatment furnace such as a tubular furnace or a hot plate. Further, in addition to the heat treatment under normal pressure (without pressing), a heat treatment under pressure such as hot pressing or HIP, or a combination of a heat treatment under normal pressure and a heat treatment under pressure can also be used. The heat treatment conditions can be appropriately selected depending on the material used for the orientation layer. For example, the atmosphere of the heat treatment can be selected from the air, vacuum, nitrogen and inert gas atmosphere. The preferred heat treatment temperature also varies depending on the material used for the orientation layer, but is preferably 1000 to 2000° C., and more preferably 1200 to 2000° C., for example. The heat treatment temperature and the retention time are related to the thickness of the orientation layer formed by heteroepitaxial growth and the thickness of the gradient composition region formed by diffusion with the sapphire substrate, and can be appropriately adjusted depending on the kind of the material, the target orientation layer, the thickness of the gradient composition region, and the like. However, in the case of using molded body prepared in advance is used as the orientation precursor layer, it is necessary to perform sintering and densification during heat treatment, and normal pressure firing at a high temperature, hot pressing, HIP, or a combination thereof is suitable. For example, when using a hot press, the surface pressure is preferably 50 kgf/cm$^2$ or more, more preferably 100 kgf/cm$^2$ or more, particularly preferably 200 kgf/cm$^2$ or more, the upper limit is not particularly limited. The firing temperature is also not particularly limited as long as sintering, densification, and heteroepitaxial growth occur, but is preferably 1000° C. or greater, more preferably 1200° C. or greater, still more preferably 1400° C. or greater, and particularly preferably 1600° C. or greater. The firing atmosphere can also be selected from atmosphere, vacuum, nitrogen and an inert gas atmosphere. As the firing jig such as a mold, those made of graphite or alumina can be used.

(d) Exposure of Surface of Orientation Layer

On the orientation layer formed near the sapphire substrate by the heat treatment, an orientation precursor layer or a surface layer having poor orientation or no orientation may exist or remain. In this case, it is preferable that the surface derived from the orientation precursor layer is subjected to processing such as grinding or polishing to expose the surface of the orientation layer. By doing so, a material having excellent orientation is exposed on the surface of the orientation layer, so that the semiconductor layer can be effectively epitaxially grown on the material. The method for removing the orientation precursor layer and the surface layer is not particularly limited, and examples thereof include a method for grinding and polishing and a method for ion beam milling. The surface of the orientation layer is preferably polished by lapping using abrasive grains or chemical mechanical polishing (CMP).

Semiconductor Layer

A semiconductor layer composed of a nitride or oxide of Group 13 element can be formed using the base substrate of the present invention. The semiconductor layer can be formed by a known method, but is preferably formed by any of vapor phase film forming methods such as various CVD methods, an HVPE method, a sublimation method, an MBE method, a PLD method, and a sputtering method, and liquid phase film forming methods such as a hydrothermal method and an Na flux method, and a mist CVD method, a hydrothermal method, or a HVPE method is particularly preferable. The mist CVD method will be described below.

Figure 2:
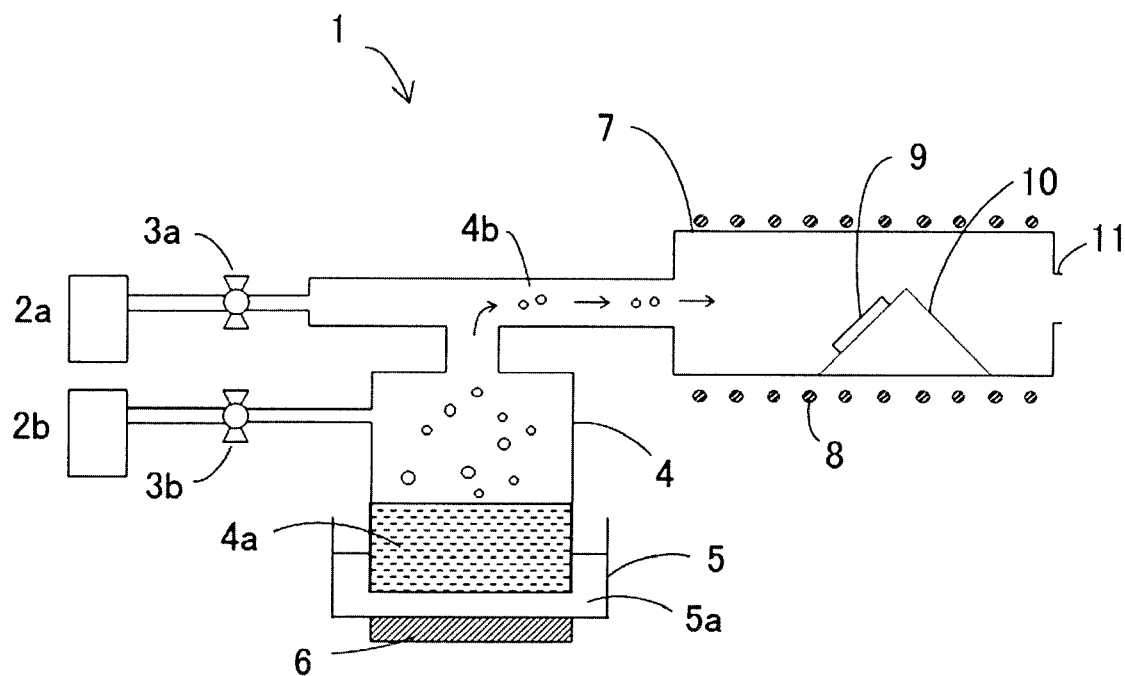
FIG. 2 is a schematic cross-sectional view showing a configuration of a mist CVD apparatus.
Figure 3:
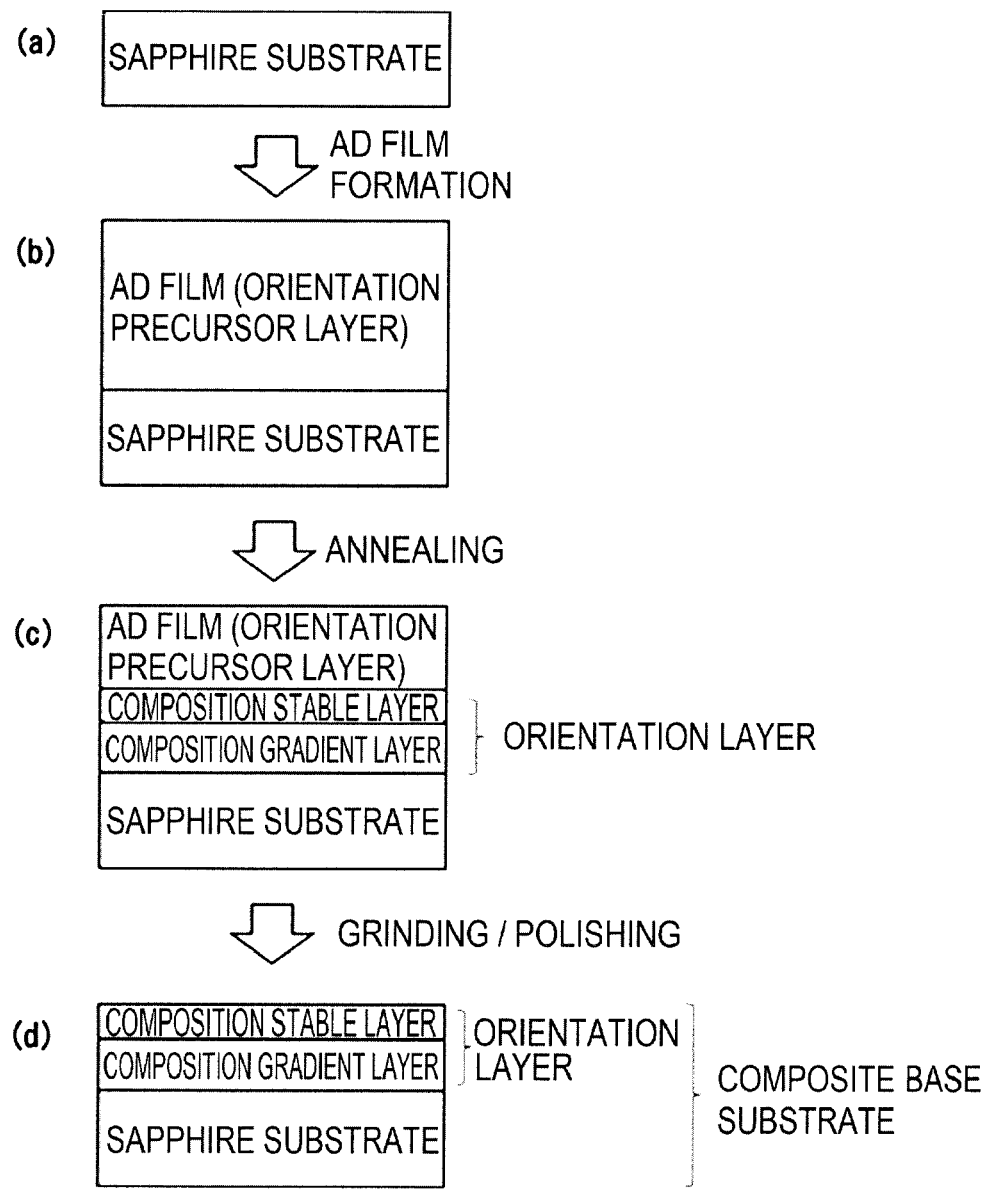
FIG. 3 is a diagram schematically showing a step of preparing a composite base substrate in Example 1.

The mist CVD method is a method in which a raw material solution is atomized or formed into droplets to generate mist or droplets, the mist or droplets are transported to a film forming chamber including a substrate using a carrier gas, and the mist or droplets are thermally decomposed and chemically reacted in the film forming chamber to form and grow a film on the substrate, and thus does not require a vacuum process and can prepare a large number of samples in a short time. Here, FIG. 2 shows an example of a mist CVD apparatus. The mist CVD apparatus 1 shown in FIG. 2 includes a susceptor 10 on which a substrate 9 is placed, a dilution gas source 2a, a carrier gas source 2b, a flow control valve 3a for controlling a flow rate of a dilution gas sent from the dilution gas source 2a, a flow control valve 3b for controlling a flow rate of a carrier gas sent from the carrier gas source 2b, a mist generating source 4 that stores a raw material solution 4a, a vessel 5 that contains water 5a, an ultrasonic vibrator 6 attached to a bottom surface of the vessel 5, a quartz tube 7 serving as a film forming chamber, a heater 8 installed around the quartz tube 7, and an exhaust port 11. The susceptor 10 is composed of quartz, and the surface on which the substrate 9 is placed is inclined from the horizontal plane.

The raw material solution 4a used in the mist CVD method is not limited as long as a semiconductor layer composed of a nitride or oxide of Group 13 elements can be obtained, and examples thereof include an organometallic complex or halide of Ga and/or a metal forming a solid solution with Ga is dissolved in a solvent. Examples of organometallic complexes include acetylacetonate complexes. Further in a case where a dopant is added to the semiconductor layer, a solution of a dopant component may be added to the raw material solution. Furthermore, an additive such as hydrochloric acid may be added to the raw material solution. Water, alcohol, or the like can be used as the solvent.

Next, the obtained raw material solution 4a is atomized or formed into droplets to generate mist or droplet 4b. A preferable example of the atomizing or droplet forming method is a method of vibrating the raw material solution 4a using the ultrasonic vibrator 6. Then, the obtained mist or droplet 4b is transported to the film forming chamber using a carrier gas. The carrier gas is not particularly limited, but one or more of an inert gas such as oxygen, ozone and nitrogen, and a reducing gas such as hydrogen can be used.

The substrate 9 is provided in the film forming chamber (quartz tube 7). The mist or droplet 4b transported to the film forming chamber is thermally decomposed and chemically reacted there to form a film on the substrate 9. The reaction temperature varies depending on the kind of the raw material solution, but is preferably 300 to 800° C., and more preferably 400 to 700° C. Further, the atmosphere in the film forming chamber is not particularly limited as long as a desired semiconductor film can be obtained, and may be an oxygen gas atmosphere, an inert gas atmosphere, a vacuum or a reducing atmosphere, but an air atmosphere is preferable.

The semiconductor layer thus prepared using the base substrate typically has a significantly low surface crystal defect density of $1.0 \times 10^6/cm^2$ or less. Such a semiconductor layer having an extremely low crystal defect density is excellent in dielectric breakdown electric field characteristics and is suitable for application in power semiconductors. The crystal defect density of the semiconductor layer can be evaluated by plane TEM observation (plan view) or cross-sectional TEM observation using a general transmission electron microscope (TEM). For example, in the case of observing a plan view using H-90001UHR-I manufactured by Hitachi as the transmission electron microscope, the acceleration voltage may be 300 kV. The test piece may be cut out so as to include the film surface and processed by ion milling so that the region of the measurement field of view of 4.1 μm×3.1 μm can be observed at eight or more places and the thickness around the measurement field of view is 150 nm. The crystal defect density is preferably $1.0 \times 10^7/cm^2$ or less, more preferably $1.0 \times 10^6/cm^2$ or less, still more preferably $4.0 \times 10^3/cm^2$ or less, and there is no particular lower limit.

As far as the present inventor knows, a technique for obtaining a semiconductor layer having such a low crystal defect density has not been conventionally known. For example, Non-Patent Literature 1 discloses that an $\alpha$-$Ga_2O_3$ layer is formed using a substrate in which a $(Al_x, Ga_{1-x})_2O_3$ layer (x=0.2 to 0.9) is introduced as a buffer layer between sapphire and the $\alpha$-$Ga_2O_3$ layer, and in the obtained $\alpha$-$Ga_2O_3$ layer, the densities of edge dislocations and screw dislocations are $3 \times 10^8/cm^2$ and $6 \times 10^8/cm^2$, respectively.

EXAMPLES

The present invention will be described in more detail with reference to the following examples.

Example 1

(1) Preparation of Composite Base Substrate
(1a) Preparation of Orientation Precursor Layer An AD film (orientation precursor layer) composed of $Cr_2O_3$ was formed on a seed substrate (sapphire substrate) by an aerosol deposition (AD) apparatus 20 shown in FIG. 1 using commercially available $Cr_2O_3$ powder as the raw material powder and sapphire (diameter 50.8 mm (2 inches), thickness 0.43 mm, c-plane, off-angle 0.3°) as the substrate. The configuration of the aerosol deposition (AD) apparatus 20 is as described above.

The AD film formation conditions were as follows. That is, Ar was used as a carrier gas, and a ceramic nozzle having a slit having a long side of 5 mm and a short side of 0.3 mm was used. The scanning conditions of the nozzle were to move 55 mm in the direction perpendicular to the long side of the slit and forward, to move 5 mm in the long side direction of the slit, to move 55 mm in the direction perpendicular to the long side of the slit and backward, and to move 5 mm in the long side direction of the slit and opposite to the initial position, repeatedly at a scanning speed of 0.5 mm/s, and at the time of 55 mm movement from the initial position in the long side direction of the slit, scanning was performed in the direction opposite to the previous direction, and the nozzle returned to the initial position. This was defined as one cycle, and repeated for 500 cycles. In one cycle of film formation at room temperature, the set pressure of the transport gas was adjusted to 0.07 MPa, the flow rate was adjusted to 8 L/min, and the pressure in the chamber was adjusted to 100 Pa or less. The AD film (orientation precursor layer) thus formed had a thickness of 120 µm.

(1b) Heat Treatment of Orientation Precursor Layer

The sapphire substrate on which the AD film was formed was taken out from the AD apparatus and annealed at 1700° C. for 4 hours in a nitrogen atmosphere.

(1c) Grinding and Polishing

The obtained substrate was fixed to a ceramic surface plate, the surface on the side derived from the AD film was ground using a grinding stone having a grit size of #2000 or less until the orientation layer was exposed, and then the plate surface was further smoothed by lapping using diamond abrasive grains. At this time, lapping was performed while gradually reducing the size of the diamond abrasive grains from 3 µm to 0.5 µm, thereby improving the flatness of the plate surface. Thereafter, mirror finishing was performed by chemical mechanical polishing (CMP) using colloidal silica to obtain a composite base substrate having an orientation layer on a sapphire substrate. The arithmetical mean roughness Ra of the orientation layer front surfaces after processing was 0.1 nm, the amount of grinding and polishing was 70 µm, and the thicknesses of the composite base substrate after polishing was 0.48 mm. The surface on the side on which the AD film is formed is referred to as a "front surface".

(2) Evaluation of Orientation Layer (2a) Cross-Section EDX

The composition of the cross-section orthogonal to the main surface of the substrate was analyzed using an energy dispersive X-ray analyzer (EDX). As a result, only Cr and O were detected in the range from the front surface of the composite base substrate to a depth of 20 µm. It was found that the ratio of Cr and O did not substantially change in the range of the depth of 20 µm, and a Cr oxide layer (composition stable region) having a thickness of 20 µm was formed. Further, Cr, O and Al were detected in the range from the Cr oxide layer to a depth of 60 µm, and it was found that a Cr—Al oxide layer (gradient composition layer) having a thickness of 60 µm was formed between the Cr oxide layer and the sapphire substrate. In the Cr—Al oxide layer, the ratios of Cr and Al were different, and it was observed that the Al concentration was high on the sapphire substrate side and decreased on the side close to the Cr oxide layer. From this, it was found that the thickness of the composition stable region was 20 µm, the thickness of the gradient composition layer was 60 µm, and the thickness of the entire orientation layer was 80 µm. It was shown that the thickness of the composite base substrate was 0.48 mm, and the thickness of the sapphire substrate in the composite base substrate was 0.40 mm.

(2b) Surface EBSD

An SEM (SU-5000, manufactured by Hitachi High-Technologies Corporation) equipped with an electron backscatter diffraction apparatus (EBSD) (Nordlys Nano, manufactured by Oxford Instruments Inc.) was used to perform reverse pole figure orientation mapping of the surface of the orientation layer composed of the Cr oxide layer in a field of view of 500 µm×500 µm. The conditions for this EBSD measurement were as follows.

<EBSD Measurement Conditions>
 Acceleration voltage: 15 kV
 Spot intensity: 70
 Working distance: 22.5 mm
 Step size: 0.5 µm
 Sample tilt angle: 70°
 Measurement program: Aztec (version 3.3).

From the obtained reverse pole figure orientation mapping, it was found that the Cr oxide layer was a layer having a biaxially oriented corundum-type crystal structure in which the Cr oxide layer was c-axis oriented in the substrate normal direction and was also oriented in the in-plane direction. From these, it was shown that the orientation layer composed of $\alpha\text{-}Cr_2O_3$ was formed on the substrate front surface. Based on the above results, the preparation step of the composite base substrate is schematically shown in FIGS. 3(a) to 3(d).

(2c) XRD

XRD in-plane measurement of the substrate front surface was performed using a multifunctional high-resolution X-ray diffractometer (D8 DISCOVER, manufactured by Bruker AXS Inc.). Specifically, after the Z axis was adjusted in accordance with the height of the substrate front surface, the axis was set by adjusting χ, φ, ω, and 2θ with respect to the (11-20) plane of the corundum-type crystal structure, and 2θ-ω measurement was performed under the following conditions.

<XRD Measurement Conditions>
 Tube voltage: 40 kV
 Tube current: 40 mA
 Detector: Triple Ge (220) Analyzer
 CuKα rays converted to parallel monochromatic light (half width 28 seconds) with a Ge (022) asymmetric reflection monochromator.
 Step width: 0.001°
 Scan speed: 1.0 second/step As a result, it was found that the a-axis length of the front surface of the orientation layer was 4.961 Å.

(2d) Evaluation of Rear Surface of Orientation Layer (Sapphire Substrate Side)

Figure 4:
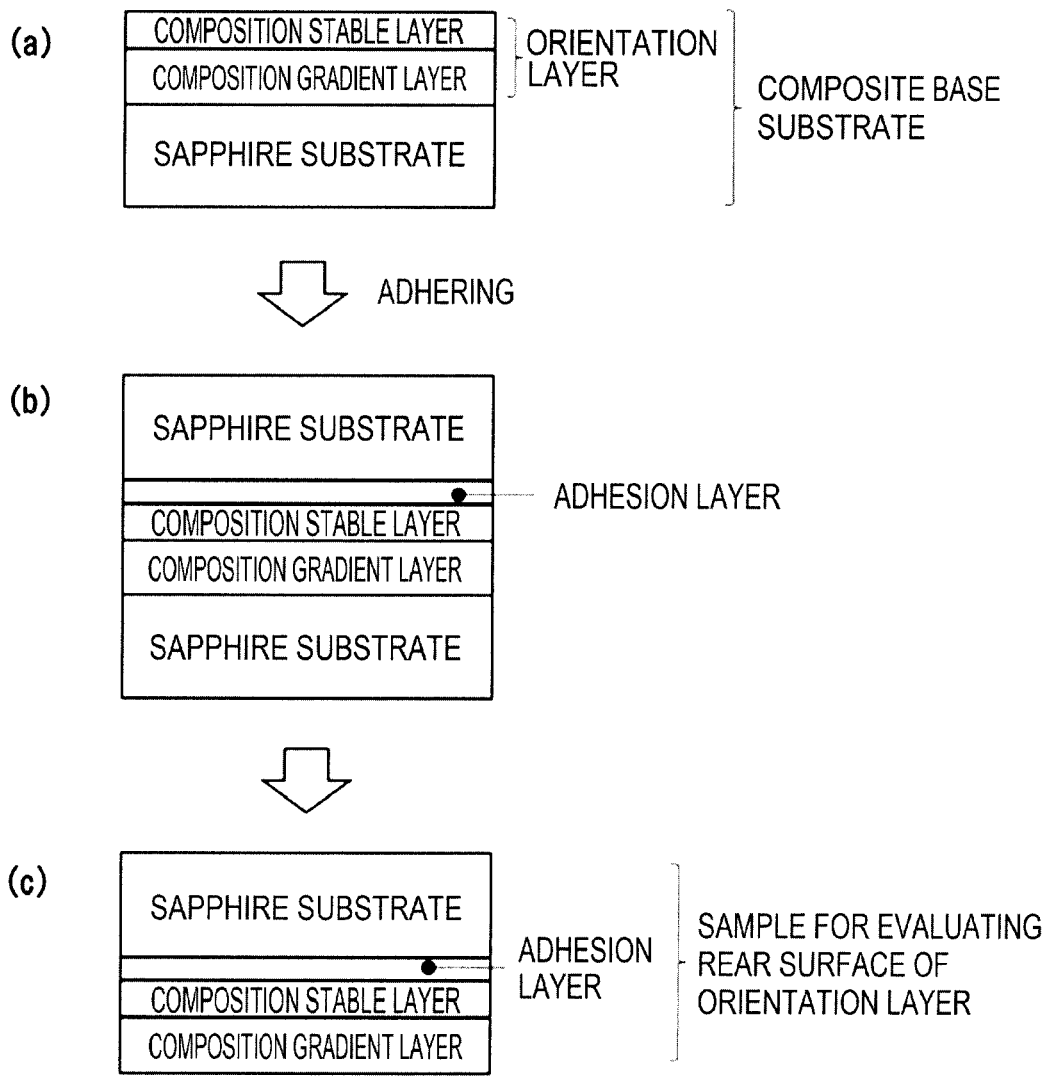
FIG. 4 is a diagram schematically showing a step of preparing a sample for evaluating a rear surface of an orientation layer in Example 1.

A composite base substrate was separately prepared in the same manner as in (1) above. The front surface (orientation layer side) of the obtained composite base substrate was adhered to another sapphire substrate, and the sapphire substrate having a thickness of 0.40 mm disposed on the rear surface side of the composite base substrate was removed by grinding to expose the rear surface of the orientation layer. Next, the surface from which the sapphire substrate had been removed (orientation layer rear surface) was ground to #2000 using a grinding stone to flatten the plate surface. Next, the plate surface was smoothed by lapping using diamond abrasive grains. At this time, lapping was performed while gradually reducing the size of the diamond abrasive grains from 3 µm to 0.5 µm, thereby improving the flatness of the plate surface. Thereafter, mirror finishing was performed by chemical mechanical polishing (CMP) using colloidal silica to prepare a sample for evaluating the rear surface of the orientation layer. From the above, the preparation step of the sample for evaluating the rear surface of the orientation layer are schematically shown in FIGS. 4(a) to 4(c).

EBSD measurement of the rear surface of the orientation layer was performed in the same manner as in (2b) above. From the obtained reverse pole figure orientation mapping, it was found that the Cr—Al oxide layer constituting the rear surface of the orientation layer was a layer having a biaxially oriented corundum-type crystal structure in which the Cr—Al oxide layer was c-axis oriented in the substrate normal direction and was also oriented in the in-plane direction. Since the rear surface of the orientation layer belongs to the composition gradient layer, it was found that the composition gradient layer is composed of a solid solution of $Cr_2O_3$ and $Al_2O_3$.

Next, XRD in-plane measurement of the rear surface of the orientation layer was performed in the same manner as in (2c) above. As a result, it was found that the rear surface of the orientation layer was also attributed to the biaxially oriented single-phase corundum material, and the a-axis length was 4.758 Å. From this, it was shown that the a-axis length of the front surface of the orientation layer is longer than the a-axis length of the rear surface of the orientation layer (that is, [{(a-axis length of front surface of orientation layer)−(a-axis length of rear surface of orientation layer)}/(a-axis length of rear surface of orientation layer)]×100=4.3%).

(2e) XRC

Using an XRD apparatus (D8-DISCOVER, manufactured by Bruker-AXS), XRC measurement was performed on the (104) plane of $\alpha$-$Cr_2O_3$ on the front surface of the orientation layer on the side used for crystal growth. Actually, after adjusting 2θ, ω, χ, and φ to perform axial alignment so that the peak of the (104) plane of $\alpha$-$Cr_2O_3$ appears, conditions were used in which the tube voltage was 40 kV, the tube current was 40 mA, the anti-scattering slit was 3 mm, ω was in the range of 15.5 to 19.5°, the ω step width was 0.005°, and the counting time was 0.5 seconds. As the X-ray source, a Ge (022) asymmetric reflection monochromator was used to convert CuKα rays into parallel monochromatic light. The half width in the XRC profile of the (104) plane of the obtained $\alpha$-$Cr_2O_3$ was determined by performing peak search after profile smoothing using XRD analysis software ("LEPOS" Ver 4.03, manufactured by Bruker-AXS). As a result, the half width of the XRC profile of the (104) plane of $\alpha$-$Cr_2O_3$ on the front surface of the orientation layer on the side used for crystal growth was 39 arcsec.

Further, the XRC measurement was performed on the (006) plane of $\alpha$-$Cr_2O_3$ was also performed on the front surface of the orientation layer on the side used for crystal growth. Using D8-DISCOVER manufactured by Bruker-AXS as the XRD apparatus, 2θ, ω, χ, and φ were adjusted, and axial alignment was performed so that a peak of the (006) plane of $\alpha$-$Cr_2O_3$ appeared, and then measurement was performed with ω=18.0 to 22.0°. Other conditions and analysis methods were the same as those in the XRC measurement of the (104) plane. As a result, the half width of the XRC profile of the (006) plane of $\alpha$-$Cr_2O_3$ on the front surface of the orientation layer on the side used for crystal growth was 33 arcsec.

(2f) Plane TEM

Plane TEM observation (plan view) was performed to evaluate the crystal defect density of the front surface of the orientation layer on the side used for crystal growth. The test piece was cut out so as to include the front surface of the orientation layer, and processed by ion milling so that the sample thickness (T) around the measurement field of view was 150 nm. The obtained sections were subjected to TEM observation at an acceleration voltage of 300 kV using a transmission electron microscope (H-90001UHR-I manufactured by Hitachi) to evaluate the crystal defect density. Actually, eight TEM images having a measurement field of view of 4.1 μm×3.1 μm were observed, and the number of defects observed therein was calculated. As a result, no crystal defect was observed in the obtained TEM images, and the crystal defect density was found to be at least less than $9.9×10^5/cm^2$.

(2g) XRD (Rotation Domain)

Using an X-ray diffraction (XRD) apparatus (D8-DISCOVER, manufactured by Bruker-AXS), φ scan was performed on the (104) plane of the corundum-type crystal structure on the front surface of the orientation layer on the side used for crystal growth under the following conditions. That is, in the XRD measurement at the above measurement position, 2θ, ω, χ, and φ was adjusted to perform axial alignment so that the peak of the (104) plane of the corundum-type crystal structure appears, and then measurement was performed by under conditions of a tube voltage of 40 kV, a tube current of 40 mA, a collimeter diameter of 0.5 mm, an anti-scattering slit of 3 mm, in a range of φ=−180° to 180°, an φ step width of 0.02°, and a counting time of 0.5 seconds. The peak top values of the three detected main peaks were averaged and taken as the peak intensity of the main peaks. Further, the peak top values of the three sub-peaks caused by the rotation domain detected at φ shifted by 60° from the main peak were averaged and taken as the peak intensity of the sub-peaks caused by the rotation domain. In this example, no sub-peak was detected, and the proportion of the peak intensity of the sub-peak to the peak intensity of the main peak was 0%.

(3) Formation of $\alpha$-$Ga_2O_3$ Film by Mist CVD Method

An $\alpha$-$Ga_2O_3$ film was formed on a front surface of the orientation layer of the obtained composite base substrate as follows using the mist CVD apparatus 1 shown in FIG. 2.

(3a) Preparation of Raw Material Solution

An aqueous solution having a gallium acetylacetonate concentration of 0.05 mol/L was prepared. At this time, 38% hydrochloric acid was contained in a volume ratio of 1.8% to prepare a raw material solution 4a.

(3b) Preparation for Film Formation

The obtained raw material solution 4a was stored in the mist generation source 4. The composite base substrate prepared in (1) above was placed on the susceptor 10 as the substrate 9, and the heater 8 was operated to raise the temperature inside the quartz tube 7 to 610° C. Next, the flow control valves 3a and 3b were opened to supply the dilution gas and the carrier gas from the dilution gas source 2a and the carrier gas source 2b, respectively, into the quartz tube 7, and after the atmosphere of the quartz tube 7 was sufficiently replaced with the dilution gas and the carrier gas, the flow rates of the dilution gas and the carrier gas were adjusted to 0.6 L/min and 1.2 L/min, respectively. Nitrogen gas was used as the dilution gas and the carrier gas.

(3c) Film Formation

The ultrasonic vibrator 6 was vibrated at 2.4 MHz, and the vibration was propagated to the raw material solution 4a through the water 5a to mist the raw material solution 4a and generate mist 4b. The mist 4b was introduced into the quartz tube 7 as a film forming chamber by the dilution gas and the carrier gas, and reacted in the quartz tube 7 to form a film on the substrate 9 by the CVD reaction on the surface of the substrate 9. Thus, a crystalline semiconductor film (semiconductor layer) was obtained. The film formation time was 60 minutes.

(4) Evaluation of Semiconductor Film
(4a) Surface EDS

As a result of EDS measurement of the surface of the obtained film, only Ga and O were detected, and it was found that the obtained film was a Ga oxide.

(4b) EBSD

An SEM (SU-5000, manufactured by Hitachi High-Technologies Corporation) equipped with an electron backscatter diffraction apparatus (EBSD) (Nordlys Nano, manufactured by Oxford Instruments Inc.) was used to perform reverse pole figure orientation mapping of the surface of the film composed of the Ga oxide in a field of view of 500 μm×500 μm. The conditions for this EBSD measurement were as follows.

<EBSD Measurement Conditions>
  Acceleration voltage: 15 kV
  Spot intensity: 70
  Working distance: 22.5 mm
  Step size: 0.5 μm
  Sample tilt angle: 70°
  Measurement program: Aztec (version 3.3)

From the obtained reverse pole figure orientation mapping, it was found that the Ga oxide film has a biaxially oriented corundum-type crystal structure in which the Ga oxide film was c-axis oriented in the substrate normal direction and was also oriented in the in-plane direction. From these, it was shown that an orientation film composed of $\alpha$-$Ga_2O_3$ was formed.

(4c) Plane TEM of Film Forming Side Surface

Plane TEM observation (plan view) was performed to evaluate the crystal defect density of the $\alpha$-$Ga_2O_3$ film. The test piece was cut out so as to include the surface on the film formation side, and processed by ion milling so that the sample thickness (T) around the measurement field of view was 150 nm. The obtained sections were subjected to TEM observation at an acceleration voltage of 300 kV using a transmission electron microscope (H-90001UHR-I manufactured by Hitachi) to evaluate the crystal defect density. Actually, eight TEM images having a measurement field of view of 4.1 μm×3.1 μm were observed. As a result, no crystal defect was observed in the obtained TEM images, and the crystal defect density was found to be at least less than $9.9 \times 10^5/cm^2$.

(4d) XRD (Rotation Domain)

In order to evaluate the degree of rotation domain content of the $\alpha$-$Ga_2O_3$ film, using an X-ray diffraction (XRD) apparatus (D8-DISCOVER, manufactured by Bruker-AXS), φ scan was performed on the (104) plane of $\alpha$-$Ga_2O_3$ on the surface of the $\alpha$-$Ga_2O_3$ film in the same manner as in (2g) above. As a result, no sub-peak caused by the rotation domain was detected, and the proportion of the peak intensity of the sub-peak to the peak intensity of the main peak was 0%.

Example 2

(1) Preparation of Composite Base Substrate

A composite base substrate was prepared in the same manner as in Example 1 except that a powder obtained by mixing a commercially available $Cr_2O_3$ powder and a commercially available $Fe_2O_3$ powder at a molar ratio of 72:28 was used as the raw material powder for the AD film.

(2) Evaluation of Orientation Layer
(2a) Cross-Section EDX

The composition of the cross-section orthogonal to the main surface of the substrate was analyzed using an energy dispersive X-ray analyzer (EDX). As a result, only Cr, Fe, and O were detected in the range from the front surface of the composite base substrate to a depth of 20 μm. It was found that the ratio of Cr, Fe, and O did not substantially change in the range up to the depth of 20 μm, and a Cr—Fe oxide layer (composition stable region) having a thickness of 20 μm was formed. Further, Cr, Fe, O, and Al were detected in the range from the Cr—Fe oxide layer to a depth of further 60 μm, and it was found that a Cr—Fe—Al oxide layer (gradient composition layer) having a depth of 60 μm was formed between the Cr—Fe oxide layer and the sapphire substrate. In the Cr—Fe—Al oxide layer, the ratios of Al to Cr and Fe were different, and it was observed that the Al concentration was high on the sapphire substrate side and decreased on the side close to the Cr—Fe oxide layer. From this, it was found that the thickness of the composition stable region was 20 μm, the thickness of the gradient composition layer was 60 μm, and the thickness of the entire orientation layer was 80 μm. It was shown that the thickness of the composite base substrate was 0.48 mm, and the thickness of the sapphire substrate in the composite base substrate was 0.40 mm.

(2b) Surface EBSD

In the same manner as in Example 1 (2b), the reverse pole figure orientation mapping of the substrate front surface composed of the Cr—Fe oxide layer was performed in a field of view of 500 μm×500 μm. From the obtained reverse pole figure orientation mapping, it was found that the Cr—Fe oxide layer was a layer having a biaxially oriented corundum-type crystal structure in which the Cr—Fe oxide layer was c-axis oriented in the substrate normal direction and was also oriented in the in-plane direction. From these, it was shown that the orientation layer composed of a solid solution of $\alpha$-$Cr_2O_3$ and $\alpha$-$Fe_2O_3$ was formed on the substrate front surface.

(2c) XRD

XRD in-plane measurement of the substrate front surface was performed in the same manner as in Example 1 (2c). As a result, it was found that the a-axis length of the front surface of the orientation layer was 4.982 Å.

(2d) Evaluation of Rear Surface of Orientation Layer (Sapphire Substrate Side)

A composite base substrate was separately prepared in the same manner as in the above (1), and then a sample for evaluating the rear surface of the orientation layer was prepared in the same manner as in Example 1 (2d). EBSD measurement of the rear surface of the orientation layer was performed in the same manner as in (2b) above. From the obtained reverse pole figure orientation mapping, it was found that the Cr—Fe—Al oxide layer constituting the rear surface of the orientation layer was a layer having a biaxially oriented corundum-type crystal structure in which the Cr—Fe—Al oxide layer was c-axis oriented in the substrate normal direction and was also oriented in the in-plane direction. Since the rear surface of the orientation layer belongs to the composition gradient layer, it was found that the composition gradient layer is composed of a solid solution of $Cr_2O_3$, $Fe_2O_3$, and $Al_2O_3$. Further, XRD in-plane measurement of the rear surface of the orientation layer was performed in the same manner as in (2c) above. As a result, it was found that the rear surface of the orientation layer was also attributed to the biaxially oriented single-phase corundum material, and the a-axis length was 4.762 Å. From this, it was shown that the a-axis length of the front surface of the orientation layer is longer than the a-axis length of the rear surface of the orientation layer (that is, [{(a-axis length of front surface of orientation layer)−(a-axis length of rear surface of orientation layer)}/(a-axis length of rear surface of orientation layer)]×100=4.6%).

(2e) XRC

In the same manner as in Example 1 (2e), XRC measurements were performed on the (104) and (006) planes of the solid solution of α-$Cr_2O_3$ and α-$Fe_2O_3$ on the front surface of the orientation layer on the side used for crystal growth. As a result, the half width of the XRC profile of the (104) plane of the solid solution of α-$Cr_2O_3$ and α-$Fe_2O_3$ on the front surface was 51 arcsec., and the half width of the XRC profile of the (006) plane of the solid solution of α-$Cr_2O_3$ and α-$Fe_2O_3$ was 49 arcsec.

(2f) Plane TEM

The crystal defect density on the front surface of the orientation layer on the side used for crystal growth was evaluated in the same manner as in Example 1 (2f). As a result, no crystal defect was observed in the obtained TEM images, and the crystal defect density was found to be at least less than $9.9×10^5/cm^2$.

(2g) XRD (Rotation Domain)

In the same manner as in Example 1 (2g), φ scan was performed on the (104) plane of the corundum-type crystal structure on the front surface of the orientation layer on the side used for crystal growth. As a result, no sub-peak caused by the rotation domain was detected, and the proportion of the peak intensity of the sub-peak to the peak intensity of the main peak was 0%.

(3) Formation of α-$Ga_2O_3$ Film by Mist CVD Method

An α-$Ga_2O_3$ film was formed on the front surface of the orientation layer of the obtained composite base substrate in the same manner as in Example 1 (3).

(4) Evaluation of Semiconductor Film (4a) Surface EDS

As a result of EDS measurement of the surface of the obtained film, only Ga and O were detected, and it was found that the obtained film was a Ga oxide.

(4b) EBSD

In the same manner as in Example 1 (4b), the reverse pole figure orientation mapping of the film surface composed of the Ga oxide was performed in a field of view of 500 µm×500 µm. From the obtained reverse pole figure orientation mapping, it was found that the Ga oxide film has a biaxially oriented corundum-type crystal structure in which the Ga oxide film was c-axis oriented in the substrate normal direction and was also oriented in the in-plane direction. From these, it was shown that an orientation film composed of α-$Ga_2O_3$ was formed.

(4c) Plane TEM of Film Forming Side Surface

Plane TEM observation (plan view) was performed to evaluate the crystal defect density of the α-$Ga_2O_3$ film. The test piece was cut out so as to include the surface on the film formation side, and processed by ion milling so that the sample thickness (T) around the measurement field of view was 150 nm. The obtained sections were subjected to TEM observation at an acceleration voltage of 300 kV using a transmission electron microscope (H-90001UHR-I manufactured by Hitachi) to evaluate the crystal defect density. Actually, eight TEM images having a measurement field of view of 4.1 µm×3.1 µm were observed. As a result, no crystal defect was observed in the obtained TEM images, and the crystal defect density was found to be at least less than $9.9×10^5/cm^2$.

(4d) XRD (Rotation Domain)

In order to evaluate the degree of rotation domain content of the α-$Ga_2O_3$ film, in the same manner as in Example 1 (4g), φ scan was performed on the (104) plane of α-$Ga_2O_3$ on the surface of the α-$Ga_2O_3$ film. As a result, no sub-peak caused by the rotation domain was detected, and the proportion of the peak intensity of the sub-peak to the peak intensity of the main peak was 0%.

Example 3

(1) Preparation of Composite Base Substrate

A composite base substrate was prepared in the same manner as in Example 1 except that a powder obtained by mixing a commercially available $Cr_2O_3$ powder, a commercially available $Fe_2O_3$ powder, and a commercially available $Al_2O_3$ powder at a molar ratio of 45:45:10 was used as the raw material powder for the AD film.

(2) Evaluation of Orientation Layer (2a) Cross-Section EDX

The composition of the cross-section orthogonal to the main surface of the substrate was analyzed using an energy dispersive X-ray analyzer (EDX). As a result, only Cr, Fe, Al, and O were detected in the range from the front surface of the composite base substrate to a depth of 20 µm. It was found that the ratio of Cr, Fe, Al, and O did not substantially change in the range of the depth of 20 µm, and a Cr—Fe—Al oxide layer (composition stable region) having a thickness of 20 µm was formed. Further, Cr, Fe, O and Al were detected in a range from the Cr—Fe—Al oxide layer to a depth of further 60 µm, but in this region, the ratio of Al to Cr and Fe was different, and it was observed that the Al concentration was high on the sapphire substrate side and decreased on the side close to the composition stable region. Therefore, it was found that this range is a composition gradient region. From this, it was found that the thickness of the composition stable region was 20 µm, the thickness of the gradient composition layer was 60 µm, and the thickness of the entire orientation layer was 80 µm. It was shown that the thickness of the composite base substrate was 0.48 mm, and the thickness of the sapphire substrate in the composite base substrate was 0.40 mm.

(2b) Surface EBSD

In the same manner as in Example 1 (2b), the reverse pole figure orientation mapping of the substrate front surface composed of the Cr—Fe—Al oxide layer was performed in a field of view of 500 µm×500 µm. From the obtained reverse pole figure orientation mapping, it was found that the Cr—Fe—Al oxide layer was a layer having a biaxially oriented corundum-type crystal structure in which the Cr—Fe—Al oxide layer was c-axis oriented in the substrate normal direction and was also oriented in the in-plane direction. From these, it was shown that the orientation layer composed of a solid solution of α-$Cr_2O_3$, α-$Fe_2O_3$, and α-$Al_2O_3$ was formed on the substrate front surface.

(2c) XRD

XRD in-plane measurement of the substrate front surface was performed in the same manner as in Example 1 (2c). As a result, it was found that the a-axis length of the front surface of the orientation layer was 4.975 Å.

(2d) Evaluation of Rear Surface of Orientation Layer (Sapphire Substrate Side)

A sample for evaluating the rear surface of the orientation layer was prepared in the same manner as in Example 1 (2d). EBSD measurement of the rear surface of the orientation layer was performed in the same manner as in (2b) above. From the obtained reverse pole figure orientation mapping, it was found that the Cr—Fe—Al oxide layer constituting the rear surface of the orientation layer was a layer having a biaxially oriented corundum-type crystal structure in which the Cr—Fe—Al oxide layer was c-axis oriented in the substrate normal direction and was also oriented in the in-plane direction. Since the rear surface of the orientation layer belongs to the composition gradient layer, it was found that the composition gradient layer is also composed of a solid solution of $Cr_2O_3$, $Fe_2O_3$, and $Al_2O_3$. Next, XRD in-plane measurement of the rear surface of the orientation layer was performed in the same manner as in (2c) above. As a result, it was found that the rear surface of the orientation layer was also attributed to the biaxially oriented single-phase corundum material, and the a-axis length was 4.755 Å. From this, it was shown that the a-axis length of the front surface of the orientation layer is longer than the a-axis length of the rear surface of the orientation layer (that is, [{(a-axis length of front surface of orientation layer)−(a-axis length of rear surface of orientation layer)}/(a-axis length of rear surface of orientation layer)]×100=4.6%).

(2e) XRC

In the same manner as in Example 1 (2e), XRC measurements were performed on the (104) and (006) planes of the solid solution of $\alpha$-$Cr_2O_3$, $\alpha$-$Fe_2O_3$, and $\alpha$-$Al_2O_3$ on the front surface of the orientation layer on the side used for crystal growth. As a result, the half width of the XRC profile of the (104) plane of the solid solution of $\alpha$-$Cr_2O_3$, $\alpha$-$Fe_2O_3$, and $\alpha$-$Al_2O_3$ on the front surface was 131 arcsec., and the half width of the XRC profile of the (006) plane of the solid solution of $\alpha$-$Cr_2O_3$, $\alpha$-$Fe_2O_3$, and $\alpha$-$Al_2O_3$ was 41 arcsec.

(2f) Plane TEM

The crystal defect density on the front surface of the orientation layer on the side used for crystal growth was evaluated in the same manner as in Example 1 (2f). As a result, no crystal defect was observed in the obtained TEM images, and the crystal defect density was found to be at least less than $9.9 \times 10^5/cm^2$.

(2g) XRD (Rotation Domain)

In the same manner as in Example 1 (2g), φ scan was performed on the (104) plane of the corundum-type crystal structure on the front surface of the orientation layer on the side used for crystal growth. As a result, no sub-peak caused by the rotation domain was detected, and the proportion of the peak intensity of the sub-peak to the peak intensity of the main peak was 0%.

(3) Formation of $\alpha$-$Ga_2O_3$ Film by Mist CVD Method

An $\alpha$-$Ga_2O_3$ film was formed on the front surface of the orientation layer of the obtained composite base substrate in the same manner as in Example 1 (3).

(4) Evaluation of Semiconductor Film (4a) Surface EDS

As a result of EDS measurement of the surface of the obtained film, only Ga and O were detected, and it was found that the obtained film was a Ga oxide.

(4b) EBSD

In the same manner as in Example 1 (4b), the reverse pole figure orientation mapping of the film surface composed of the Ga oxide was performed in a field of view of 500 μm×500 μm. From the obtained reverse pole figure orientation mapping, it was found that the Ga oxide film has a biaxially oriented corundum-type crystal structure in which the Ga oxide film was c-axis oriented in the substrate normal direction and was also oriented in the in-plane direction. From these, it was shown that an orientation film composed of $\alpha$-$Ga_2O_3$ was formed.

(4c) Plane TEM of Film Forming Side Surface

Plane TEM observation (plan view) was performed to evaluate the crystal defect density of the $\alpha$-$Ga_2O_3$ film. The test piece was cut out so as to include the surface on the film formation side, and processed by ion milling so that the sample thickness (T) around the measurement field of view was 150 nm. The obtained sections were subjected to TEM observation at an acceleration voltage of 300 kV using a transmission electron microscope (H-90001UHR-I manufactured by Hitachi) to evaluate the crystal defect density. Actually, eight TEM images having a measurement field of view of 4.1 μm×3.1 μm were observed. As a result, no crystal defect was observed in the obtained TEM images, and the crystal defect density was found to be at least less than $9.9 \times 10^5/cm^2$.

(4d) XRD (Rotation Domain)

In order to evaluate the degree of rotation domain content of the $\alpha$-$Ga_2O_3$ film, in the same manner as in Example 1 (4g), φ scan was performed on the (104) plane of $\alpha$-$Ga_2O_3$ on the surface of the $\alpha$-$Ga_2O_3$ film. As a result, no sub-peak caused by the rotation domain was detected, and the proportion of the peak intensity of the sub-peak to the peak intensity of the main peak was 0%.

Example 4

(1) Preparation of Composite Base Substrate

A composite base substrate was prepared in the same manner as in Example 1 except that a powder obtained by mixing a commercially available $Cr_2O_3$ powder and a commercially available $TiO_2$ powder at a molar ratio of 97:3 was used as the raw material powder for the AD film.

(2) Evaluation of Orientation Layer (2a) Cross-Section EDX

The composition of the cross-section orthogonal to the main surface of the substrate was analyzed using an energy dispersive X-ray analyzer (EDX). As a result, only Cr, Ti, and O were detected in the range from the front surface of the composite base substrate to a depth of 20 μm. It was found that the ratio of Cr, Ti, and O did not substantially change in the range of the depth of 20 μm, and a Cr—Ti oxide layer (composition stable region) having a thickness of 20 μm was formed. Further, Cr, Ti, O, and Al were detected in the range from the Cr—Ti oxide layer to a depth of further 60 μm, and it was found that a Cr—Ti—Al oxide layer (gradient composition layer) having a thickness of 60 μm was formed between the Cr—Ti oxide layer and the sapphire substrate. In the Cr—Ti—Al oxide layer, the ratios of Al to Cr and Ti were different, and it was observed that the Al concentration was high on the sapphire substrate side and decreased on the side close to the Cr—Ti oxide layer. From this, it was found that the thickness of the composition stable region was 20 μm, the thickness of the gradient composition layer was 60 μm, and the thickness of the entire orientation layer was 80 μm. It was shown that the thickness of the composite base substrate was 0.48 mm, and the thickness of the sapphire substrate in the composite base substrate was 0.40 mm.

(2b) Surface EBSD

In the same manner as in Example 1 (2b), the reverse pole figure orientation mapping of the substrate front surface composed of the Cr—Ti oxide layer was performed in a field of view of 500 μm×500 μm. From the obtained reverse pole figure orientation mapping, it was found that the Cr—Ti oxide layer was a layer having a biaxially oriented corundum-type crystal structure in which the Cr—Ti oxide layer was c-axis oriented in the substrate normal direction and was also oriented in the in-plane direction. From these, it was shown that an orientation layer composed of a material in which Ti component was dissolved in $\alpha$-$Cr_2O_3$ was formed on the substrate front surface.

(2c) XRD

The XRD in-plane measurement of the substrate front surface was performed in the same manner as in Example 1

(2c). As a result, it was found that the a-axis length of the front surface of the orientation layer was 4.971 Å.

(2d) Evaluation of Rear Surface of Orientation Layer (Sapphire Substrate Side)

A sample for evaluating the rear surface of the orientation layer was prepared in the same manner as in Example 1 (2d). EBSD measurement of the rear surface of the orientation layer was performed in the same manner as in (2b) above. From the obtained reverse pole figure orientation mapping, it was found that the Cr—Ti—Al oxide layer constituting the rear surface of the orientation layer was a layer having a biaxially oriented corundum-type crystal structure in which the Cr—Ti—Al oxide layer was c-axis oriented in the substrate normal direction and was also oriented in the in-plane direction. Since the rear surface of the orientation layer belongs to the composition gradient layer, it was found that the composition gradient layer is composed of a solid solution of $Cr_2O_3$, Ti component, and $Al_2O_3$. Next, XRD in-plane measurement of the rear surface of the orientation layer was performed in the same manner as in (2c) above. As a result, it was found that the rear surface of the orientation layer was also attributed to the biaxially oriented single-phase corundum material, and the a-axis length was 4.756 Å. From this, it was shown that the a-axis length of the front surface of the orientation layer is longer than the a-axis length of the rear surface of the orientation layer (that is, [{(a-axis length of front surface of orientation layer)–(a-axis length of rear surface of orientation layer)}/(a-axis length of rear surface of orientation layer)]×100=4.5%).

(2e) XRC

In the same manner as in Example 1 (2e), XRC measurements were performed on the (104) and (006) planes of the material in which the Ti component was dissolved in $\alpha$-$Cr_2O_3$ on the front surface of the orientation layer on the side used for crystal growth. As a result, the half width of the XRC profile of the (104) plane of the material in which Ti component was dissolved in $\alpha$-$Cr_2O_3$ on the front surface was 33 arcsec., and the half width of the XRC profile of the (006) plane of the material in which Ti component was dissolved in $\alpha$-$Cr_2O_3$ was 31 arcsec.

(2f) Plane TEM

The crystal defect density on the front surface of the orientation layer used for crystal growth was evaluated in the same manner as in Example 1 (2f). As a result, no crystal defect was observed in the obtained TEM images, and the crystal defect density was found to be at least less than $9.9 \times 10^5/cm^2$.

(2g) XRD (Rotation Domain)

In the same manner as in Example 1 (2g), $\varphi$ scan was performed on the (104) plane of the corundum-type crystal structure on the front surface of the orientation layer on the side used for crystal growth. As a result, no sub-peak caused by the rotation domain was detected, and the proportion of the peak intensity of the sub-peak to the peak intensity of the main peak was 0%.

(3) Formation of $\alpha$-$Ga_2O_3$ Film by Mist CVD Method

An $\alpha$-$Ga_2O_3$ film was formed on the front surface of the orientation layer of the obtained composite base substrate in the same manner as in Example 1 (3).

(4) Evaluation of Semiconductor Film (4a) Surface EDS

As a result of EDS measurement of the surface of the obtained film, only Ga and O were detected, and it was found that the obtained film was a Ga oxide.

(4b) EBSD

In the same manner as in Example 1 (4b), the reverse pole figure orientation mapping of the film surface composed of the Ga oxide was performed in a field of view of 500 μm×500 μm. From the obtained reverse pole figure orientation mapping, it was found that the Ga oxide film has a biaxially oriented corundum-type crystal structure in which the Ga oxide film was c-axis oriented in the substrate normal direction and was also oriented in the in-plane direction. From these, it was shown that an orientation film composed of $\alpha$-$Ga_2O_3$ was formed.

(4c) Plane TEM of Film Forming Side Surface

Plane TEM observation (plan view) was performed to evaluate the crystal defect density of the $\alpha$-$Ga_2O_3$ film. The test piece was cut out so as to include the surface on the film formation side, and processed by ion milling so that the sample thickness (T) around the measurement field of view was 150 nm. The obtained sections were subjected to TEM observation at an acceleration voltage of 300 kV using a transmission electron microscope (H-90001UHR-I manufactured by Hitachi) to evaluate the crystal defect density. Actually, eight TEM images having a measurement field of view of 4.1 μm×3.1 μm were observed. As a result, no crystal defect was observed in the obtained TEM images, and the crystal defect density was found to be at least less than $9.9 \times 10^5/cm^2$.

(4d) XRD (Rotation Domain)

In order to evaluate the degree of rotation domain content of the $\alpha$-$Ga_2O_3$ film, in the same manner as in Example 1 (4g), $\varphi$ scan was performed on the (104) plane of $\alpha$-$Ga_2O_3$ on the surface of the $\alpha$-$Ga_2O_3$ film. As a result, no sub-peak caused by the rotation domain was detected, and the proportion of the peak intensity of the sub-peak to the peak intensity of the main peak was 0%.

Example 5

(1) Preparation of Composite Base Substrate

A composite base substrate was prepared in the same manner as in Example 1 except that a powder obtained by mixing a commercially available $Cr_2O_3$ powder, a commercially available $TiO_2$ powder, and a commercially available $Fe_2O_3$ powder at a molar ratio of 82:2:16 was used as the raw material powder for the AD film.

(2) Evaluation of Orientation Layer (2a) Cross-Section EDX

The composition of the cross-section orthogonal to the main surface of the substrate was analyzed using an energy dispersive X-ray analyzer (EDX). As a result, only Cr, Ti, Fe, and O were detected in the range from the front surface of the composite base substrate to a depth of 20 μm. It was found that the ratio of Cr, Ti, Fe, and O did not substantially change in the range of the depth of 20 μm, and a Cr—Ti—Fe oxide layer (composition stable region) having a thickness of 20 μm was formed. Further, Cr, Ti, Fe, O, and Al were detected in the range from the Cr—Ti—Fe oxide layer to a depth of further 30 μm, and it was found that a Cr—Ti—Fe—Al oxide layer (gradient composition layer) having a thickness of 60 μm was formed between the Cr—Ti—Fe oxide layer and the sapphire substrate. In the Cr—Ti—Fe—Al oxide layer, the ratios of Al to Cr, Ti, and Fe were different, and it was observed that the Al concentration was high on the sapphire substrate side and decreased on the side close to the Cr—Ti—Fe oxide layer. From this, it was found that the thickness of the composition stable region was 20 μm, the thickness of the gradient composition layer was 60 μm, and the thickness of the entire orientation layer was 80 μm. It was shown that the thickness of the composite base substrate was 0.48 mm, and the thickness of the sapphire substrate in the composite base substrate was 0.40 mm.

(2b) Surface EBSD

In the same manner as in Example 1 (2b), the reverse pole figure orientation mapping of the substrate front surface composed of the Cr—Ti—Fe oxide layer was performed in a field of view of 500 μm×500 μm. From the obtained reverse pole figure orientation mapping, it was found that the Cr—Ti—Fe oxide layer was a layer having a biaxially oriented corundum-type crystal structure in which the Cr—Ti—Fe oxide layer was c-axis oriented in the substrate normal direction and was also oriented in the in-plane direction. From these, it was shown that the orientation layer composed of a solid solution of α-$Cr_2O_3$, Ti component, and α-$Fe_2O_3$ was formed on the substrate front surface.

(2c) XRD

The XRD in-plane measurement of the substrate front surface was performed in the same manner as in Example 1 (2c). As a result, it was found that the a-axis length of the front surface of the orientation layer was 4.981 Å.

(2d) Evaluation of Rear Surface of Orientation Layer (Sapphire Substrate Side)

A sample for evaluating the rear surface of the orientation layer was prepared in the same manner as in Example 1 (2d). EBSD measurement of the rear surface of the orientation layer was performed in the same manner as in (2b) above. From the obtained reverse pole figure orientation mapping, it was found that the Cr—Ti—Fe—Al oxide layer constituting the rear surface of the orientation layer was a layer having a biaxially oriented corundum-type crystal structure in which the Cr—Ti—Fe—Al oxide layer was c-axis oriented in the substrate normal direction and was also oriented in the in-plane direction. Since the rear surface of the orientation layer belongs to the composition gradient layer, it was found that the composition gradient layer is composed of a solid solution of $Cr_2O_3$, Ti component, $Fe_2O_3$, and $Al_2O_3$. Next, XRD in-plane measurement of the rear surface of the orientation layer was performed in the same manner as in (2c) above. As a result, it was found that the rear surface of the orientation layer was also attributed to the biaxially oriented single-phase corundum material, and the a-axis length was 4.763 Å. From this, it was shown that the a-axis length of the front surface of the orientation layer is longer than the a-axis length of the rear surface of the orientation layer (that is, [{(a-axis length of front surface of orientation layer)–(a-axis length of rear surface of orientation layer)}/(a-axis length of rear surface of orientation layer)]×100=4.6%).

(2e) XRC

In the same manner as in Example 1 (2e), XRC measurements were performed on the (104) and (006) planes of the solid solution of α-$Cr_2O_3$, Ti component, and α-$Fe_2O_3$ on the front surface of the orientation layer on the side used for crystal growth. As a result, the half width of the XRC profile of the (104) plane of the solid solution of α-$Cr_2O_3$, Ti component, and α-$Fe_2O_3$ on the front surface was 126 arcsec., and the half width of the XRC profile of the (006) plane of the solid solution of α-$Cr_2O_3$, Ti component, and α-$Fe_2O_3$ was 43 arcsec.

(2f) Plane TEM

The crystal defect density on the front surface of the orientation layer used for crystal growth was evaluated in the same manner as in Example 1 (2f). As a result, no crystal defect was observed in the obtained TEM images, and the crystal defect density was found to be at least less than $9.9 \times 10^5/cm^2$.

(2g) XRD (Rotation Domain)

In the same manner as in Example 1 (2g), φ scan was performed on the (104) plane of the corundum-type crystal structure on the front surface of the orientation layer on the side used for crystal growth. As a result, no sub-peak caused by the rotation domain was detected, and the proportion of the peak intensity of the sub-peak to the peak intensity of the main peak was 0%.

(3) Formation of α-$Ga_2O_3$ Film by Mist CVD Method

An α-$Ga_2O_3$ film was formed on the front surface of the orientation layer of the obtained composite base substrate in the same manner as in Example 1 (3).

(4) Evaluation of Semiconductor Film (4a) Surface EDS

As a result of EDS measurement of the surface of the obtained film, only Ga and O were detected, and it was found that the obtained film was a Ga oxide.

(4b) EBSD

In the same manner as in Example 1 (4b), the reverse pole figure orientation mapping of the film surface composed of the Ga oxide was performed in a field of view of 500 μm×500 μm. From the obtained reverse pole figure orientation mapping, it was found that the Ga oxide film has a biaxially oriented corundum-type crystal structure in which the Ga oxide film was c-axis oriented in the substrate normal direction and was also oriented in the in-plane direction. From these, it was shown that an orientation film composed of α-$Ga_2O_3$ was formed.

(4c) Plane TEM of Film Forming Side Surface

Plane TEM observation (plan view) was performed to evaluate the crystal defect density of the α-$Ga_2O_3$ film. The test piece was cut out so as to include the surface on the film formation side, and processed by ion milling so that the sample thickness (T) around the measurement field of view was 150 nm. The obtained sections were subjected to TEM observation at an acceleration voltage of 300 kV using a transmission electron microscope (H-90001UHR-I manufactured by Hitachi) to evaluate the crystal defect density. Actually, eight TEM images having a measurement field of view of 4.1 μm×3.1 μm were observed. As a result, no crystal defect was observed in the obtained TEM images, and the crystal defect density was found to be at least less than $9.9 \times 10^5/cm^2$.

(4d) XRD (Rotation Domain)

In order to evaluate the degree of rotation domain content of the α-$Ga_2O_3$ film, in the same manner as in Example 1 (4g), φ scan was performed on the (104) plane of α-$Ga_2O_3$ on the surface of the α-$Ga_2O_3$ film. As a result, no sub-peak caused by the rotation domain was detected, and the proportion of the peak intensity of the sub-peak to the peak intensity of the main peak was 0%.

Example 6

(1) Preparation of Base Substrate (1a) Preparation of Composite Base Substrate

A composite base substrate was obtained in the same manner as in Example 1 (1).

(1b) Thickening of Orientation Layer

Next, the AD film (orientation precursor layer) was formed again on the orientation layer of the composite base substrate. The aerosol deposition (AD) apparatus 20 shown in FIG. 1 formed an AD film (orientation precursor layer) composed of $Cr_2O_3$ on the orientation layer of the composite base substrate.

The AD film formation conditions were as follows. That is, Ar was used as a carrier gas, and a ceramic nozzle having a slit having a long side of 5 mm and a short side of 0.3 mm was used. The scanning conditions of the nozzle were to move 55 mm in the direction perpendicular to of the long side of the slit and forward, to move 5 mm in the long side direction of the slit, to move 55 mm in the direction perpendicular to the long side of the slit and backward, and to move 5 mm in the long side direction of the slit and opposite to the initial position, repeatedly at a scanning speed of 0.5 mm/s, and at the time of 55 mm movement from the initial position in the long side direction of the slit, scanning was performed in the direction opposite to the previous direction, and the nozzle returned to the initial position. This was defined as one cycle, and repeated for 500 cycles. In one cycle of film formation at room temperature, the set pressure of the transport gas was adjusted to 0.07 MPa, the flow rate was adjusted to 8 L/min, and the pressure in the chamber was adjusted to 100 Pa or less. The AD film (orientation precursor layer) thus formed had a thickness of 120 μm.

The composite base substrate on which the AD film was formed was taken out from the AD apparatus and annealed at 1700° C. for 4 hours in a nitrogen atmosphere.

The obtained substrate was fixed to a ceramic surface plate, the surface on the side derived from the AD film was ground using a grinding stone having a grit size of #2000 or less until the orientation layer was exposed, and then the plate surface was further smoothed by lapping using diamond abrasive grains. At this time, lapping was performed while gradually reducing the size of the diamond abrasive grains from 3 μm to 0.5 μm, thereby improving the flatness of the plate surface. Thereafter, mirror finishing was performed by chemical mechanical polishing (CMP) using colloidal silica to obtain a composite base substrate having an orientation layer on a sapphire substrate. The arithmetical mean roughness Ra of the orientation layer front surfaces after processing was 0.1 nm, the amount of grinding and polishing was 50 μm, and the thicknesses of the composite base substrate after polishing was 0.48 mm.

The series of steps for increasing the thickness (that is, AD film formation-anneal-grinding and polishing) was repeated nine times in total (that is, the series of steps was performed ten times in total when the procedure for preparing the composite base substrate of Example 6 (1a) was counted as one time). As a result, the thickness of the composite base substrate after the final polishing was completed was 0.93 mm. The surface on the side on which the AD film is formed is referred to as a "front surface".

(1c) Self-Standing of Orientation Layer

The substrate obtained in the above (1b) was fixed to a ceramic surface plate, and the surface (rear surface) opposite to the surface (front surface) on which the AD film was formed, that is, the surface on the sapphire substrate side was ground using a grinding stone to remove the sapphire substrate. Thereafter, the front surface of the orientation layer on the side from which the sapphire substrate had been removed was ground to #2000 using a grinding stone to flatten the plate surface. Next, the plate surface was smoothed by lapping using diamond abrasive grains. At this time, lapping was performed while gradually reducing the size of the diamond abrasive grains from 3 μm to 0.5 μm, thereby improving the flatness of the plate surface. The amount of grinding and polishing including sapphire was 480 μm, and the thickness of the substrate after polishing was 0.45 mm. The obtained substrate became a self-standing substrate composed of only the orientation layer.

(2) Evaluation of Self-Standing Substrate (2a) Cross-Section EDX

The composition of the cross-section orthogonal to the main surface of the substrate was analyzed using an energy dispersive X-ray analyzer (EDX). As a result, only Cr and O were detected in the entire cross-section of the self-standing substrate. The ratios of Cr and O remained almost unchanged over the entire region, and it was found that the self-standing substrate was formed of a single-phase Cr oxide.

(2b) Surface EBSD

An SEM (SU-5000, manufactured by Hitachi High-Technologies Corporation) equipped with an electron backscatter diffraction apparatus (EBSD) (Nordlys Nano, manufactured by Oxford Instruments Inc.) was used to perform reverse pole figure orientation mapping of the front surface (surface on which the AD film was formed) and rear surface (surface on which the sapphire substrate was in contact) of the substrate composed of the Cr oxide layer in a field of view of 500 μm×500 μm. The conditions for the EBSD measurement were the same as in Example 1 (2b).

From the obtained reverse pole figure orientation mapping, it was found that the self-standing substrate was composed of a biaxially oriented corundum-type crystal structure in which the self-standing substrate was c-axis oriented in the substrate normal direction on both the front and rear surfaces and was also oriented in the in-plane direction. From these results, it was shown that the front and rear surfaces of the self-standing substrate were formed of a biaxially oriented single phase $\alpha$-$Cr_2O_3$.

(2c) XRD

The XRD in-plane measurement of the front surface and the rear surface of the self-standing substrate was performed in the same manner as in Example 1 (2c). As a result, it was found that the a-axis lengths of the front surface and the rear surface of the self-standing substrate were both 4.961 Å.

(2d) XRC

XRC measurement of the (104) plane and the (006) plane of $\alpha$-$Cr_2O_3$ on the surface of the self-standing substrate was performed in the same manner as in Example 1 (2e). As a result, the half width of the XRC profile of the (104) plane of $\alpha$-$Cr_2O_3$ on the surface was 415 arcsec., and the half width of the XRC profile of the (006) plane of $\alpha$-$Cr_2O_3$ was 49 arcsec.

(2e) Plane TEM

The crystal defect density on the surface of the self-standing substrate was evaluated in the same manner as in Example 1 (2f). As a result, no crystal defect was observed in the obtained TEM images, and the crystal defect density was found to be at least less than $9.9 \times 10^5$/cm$^2$.

(2f) Rotation Domain

In the same manner as in Example 1 (2g), φ scan was performed on the (104) plane of the corundum-type crystal structure on the front surface of the orientation layer on the side used for crystal growth. As a result, no sub-peak caused by the rotation domain was detected, and the proportion of the peak intensity of the sub-peak to the peak intensity of the main peak was 0%.

(3) Formation of $\alpha$-$Ga_2O_3$ Film by Mist CVD Method

An $\alpha$-$Ga_2O_3$ film was formed on the obtained self-standing substrate in the same manner as in Example 1 (3).

(4) Evaluation of Semiconductor Film (4a) Surface EDS

As a result of EDS measurement of the surface of the obtained film, only Ga and O were detected, and it was found that the obtained film was a Ga oxide.

(4b) EBSD

In the same manner as in Example 1 (4b), the reverse pole figure orientation mapping of the film surface composed of the Ga oxide was performed in a field of view of 500 μm×500 μm. From the obtained reverse pole figure orientation mapping, it was found that the Ga oxide film has a biaxially oriented corundum-type crystal structure in which the Ga oxide film was c-axis oriented in the substrate normal direction and was also oriented in the in-plane direction. From these, it was shown that an orientation film composed of α-Ga$_2$O$_3$ was formed.

(4c) Plane TEM of Film Forming Side Surface

Plane TEM observation (plan view) was performed to evaluate the crystal defect density of the α-Ga$_2$O$_3$ film. The test piece was cut out so as to include the surface on the film formation side, and processed by ion milling so that the sample thickness (T) around the measurement field of view was 150 nm. The obtained sections were subjected to TEM observation at an acceleration voltage of 300 kV using a transmission electron microscope (H-90001UHR-I manufactured by Hitachi) to evaluate the crystal defect density. Actually, eight TEM images having a measurement field of view of 4.1 μm×3.1 μm were observed. As a result, no crystal defect was observed in the obtained TEM images, and the crystal defect density was found to be at least less than $9.9 \times 10^5$/cm$^2$.

(4d) XRD (Rotation Domain)

In order to evaluate the degree of rotational domain content of the α-Ga$_2$O$_3$ film, in the same manner as in Example 1 (4g), φ scan was performed on the (104) plane of α-Ga$_2$O$_3$ on the surface of the α-Ga$_2$O$_3$ film. As a result, no sub-peak caused by the rotation domain was detected, and the proportion of the peak intensity of the sub-peak to the peak intensity of the main peak was 0%.

Example 7 (Comparison)

(1) Preparation of Composite Base Substrate

Using the mist CVD apparatus shown in FIG. 2, an α-Cr$_2$O$_3$ film was formed on the surface of a sapphire substrate (50.8 mm diameter (2 inches), 0.43 mm thickness, c-plane, 0.3° off-angle).

(1a) Preparation of Raw Material Solution

An aqueous solution having an ammonium dichromate concentration of 0.1 mol/L was prepared as the raw material solution 4a.

(1b) Preparation for Film Formation

The obtained raw material solution 4a was stored in the mist generation source 4. The sapphire substrate was placed on the susceptor 10 as the substrate 9, and the heater 8 was operated to raise the temperature inside the quartz tube 7 to 410° C. Next, the flow control valves 3a and 3b were opened to supply the dilution gas and the carrier gas from the dilution gas source 2a and the carrier gas source 2b into the quartz tube 7, and after the atmosphere of the quartz tube 7 was sufficiently replaced with the dilution gas and the carrier gas, the flow rates of the dilution gas and the carrier gas were adjusted to 2.2 L/min and 4.8 L/min, respectively. Nitrogen gas was used as the dilution gas and the carrier gas.

(1c) Film Formation

The ultrasonic vibrator 6 was vibrated at 2.4 MHz, and the vibration was propagated to the raw material solution 4a through the water 5a to mist the raw material solution 4a and generate mist 4b. The mist 4b was introduced into the quartz tube 7 as a film forming chamber by the dilution gas and the carrier gas, and reacted in the quartz tube 7 to form a film on the substrate 9 for 30 minutes by the CVD reaction on the surface of the substrate 9, thereby obtaining an oxide deposit layer.

(2) Evaluation of Orientation Layer (2a) Surface EDX

The composition of the substrate front surface was analyzed using an energy dispersive X-ray analyzer (EDX). As a result, only Cr and O were detected, and it was found that the oxide deposit layer was Cr oxide. Note that it was difficult to perform cross-sectional EDX measurement due to the small film thickness.

(2b) Surface EBSD

An SEM (SU-5000, manufactured by Hitachi High-Technologies Corporation) equipped with an electron backscatter diffraction apparatus (EBSD) (Nordlys Nano, manufactured by Oxford Instruments Inc.) was used to perform reverse pole figure orientation mapping of the surface of the substrate composed of the Cr oxide layer in a field of view of 500 μm×500 μm. The conditions for this EBSD measurement were as follows.

<EBSD Measurement Conditions>

Acceleration voltage: 15 kV

Spot intensity: 70

Working distance: 22.5 mm

Step size: 0.5 μm

Sample tilt angle: 70°

Measurement program: Aztec (version 3.3)

From the obtained reverse pole figure orientation mapping, it was found that the Cr oxide layer is a layer having a biaxially oriented corundum-type crystal structure in which the Cr oxide layer was c-axis oriented in the substrate normal direction. However, a domain shifted by 60° was observed in the in-plane direction. From these, it was shown that the c-axis orientation layer of α-Cr$_2$O$_3$ was formed on the substrate front surface.

(2c) XRD

XRD in-plane measurement of the substrate front surface was performed using a multifunctional high-resolution X-ray diffractometer (D8 DISCOVER, manufactured by Bruker AXS Inc.). Specifically, after the Z axis was adjusted in accordance with the height of the substrate front surface, the axis was set by adjusting χ, φ, ω, and 2θ with respect to the (11-20) plane of the corundum-type crystal structure, and 2θ-ω measurement was performed under the following conditions.

<XRD Measurement Conditions>

Tube voltage: 40 kV

Tube current: 40 mA

Detector: Triple Ge (220) Analyzer

CuKα rays converted to parallel monochromatic light (half width 28 seconds) with a Ge (022) asymmetric reflection monochromator.

Step width: 0.001°

Scan speed: 1.0 second/step

As a result, it was found that the a-axis length of the front surface of the orientation layer was 4.961 Å.

(2d) Cross-Sectional TEM Observation of Orientation Layer

A cross-sectional TEM observation was performed to evaluate the change in the lattice constant of the α-Cr$_2$O$_3$ film. The cross-sectional sample was cut out so as to include the front surface and the rear surface (interface on the sapphire side) on the film formation side, and processed by ion milling so that the sample thickness (T) around the measurement field of view was 150 nm. The obtained sections were subjected to cross-sectional TEM observation at an acceleration voltage of 300 kV using a transmission electron microscope (H-90001UHR-I manufactured by Hitachi) to obtain electron-beam diffraction images of the front and rear surfaces of the α-Cr$_2$O$_3$ film. The electron beam incident direction was Cr$_2$O$_3$ <1-10>. As a result, no difference was observed between the electron diffraction images of the front and rear surfaces of the film, and it was found that there was no change in lattice constants between the front and rear surfaces of the α-Cr$_2$O$_3$ film.

(2e) XRC

In the same manner as in Example 1 (2e), XRC measurements were performed on the (104) and (006) planes of corundum-type crystal structure on the front surface of the orientation layer on the side used for crystal growth. As a result, the half width of the XRC profile of the (104) plane on the front surface was 1856 arcsec., and the half width of the XRC profile of the (006) plane was 148 arcsec.

(2f) Plane TEM

The crystal defect density on the front surface of the orientation layer on the side used for crystal growth was evaluated in the same manner as in Example 1 (2f). As a result, a large number of crystal defects were observed in the obtained TEM images, and the crystal defect density was found to be at least $1.0 \times 10^{11}/cm^2$ or more.

(2g) XRD (Rotation Domain)

In the same manner as in Example 1 (2g), φ scan was performed on the (104) plane of the corundum-type crystal structure on the front surface of the orientation layer on the side used for crystal growth. As a result, a sub-peak caused by the rotation domain was detected, and the proportion of the peak intensity of the sub-peak to the peak intensity of the main peak was 7.3%.

(3) Formation of α-Ga$_2$O$_3$ Film by Mist CVD Method

An α-Ga$_2$O$_3$ film was formed on a front surface of the orientation layer of the obtained composite base substrate as follows using the mist CVD apparatus 1 shown in FIG. 2.

(3a) Preparation of Raw Material Solution

An aqueous solution having a gallium acetylacetonate concentration of 0.05 mol/L was prepared. At this time, 38% hydrochloric acid was contained in a volume ratio of 1.8% to prepare a raw material solution 4a.

(3b) Preparation for Film Formation

The obtained raw material solution 4a was stored in the mist generation source 4. The composite base substrate prepared in (1) above was placed on the susceptor 10 as the substrate 9, and the heater 8 was operated to raise the temperature inside the quartz tube 7 to 610° C. Next, the flow control valves 3a and 3b were opened to supply the dilution gas and the carrier gas from the dilution gas source 2a and the carrier gas source 2b into the quartz tube 7, and after the atmosphere of the quartz tube 7 was sufficiently replaced with the dilution gas and the carrier gas, the flow rates of the dilution gas and the carrier gas were adjusted to 0.6 L/min and 1.2 L/min, respectively. Nitrogen gas was used as the dilution gas and the carrier gas.

(3c) Film Formation

The ultrasonic vibrator 6 was vibrated at 2.4 MHz, and the vibration was propagated to the raw material solution 4a through the water 5a to mist the raw material solution 4a and generate mist 4b. The mist 4b was introduced into the quartz tube 7 as a film forming chamber by the dilution gas and the carrier gas, and reacted in the quartz tube 7 to form a film on the substrate 9 by the CVD reaction on the surface of the substrate 9. Thus, a crystalline semiconductor film (semiconductor layer) was obtained. The film formation time was 60 minutes.

(4) Evaluation of Semiconductor Film (4a) Surface EDS

As a result of EDS measurement of the surface of the obtained film, only Ga and O were detected, and it was found that the obtained film was a Ga oxide.

(4b) EBSD

An SEM (SU-5000, manufactured by Hitachi High-Technologies Corporation) equipped with an electron backscatter diffraction apparatus (EBSD) (Nordlys Nano, manufactured by Oxford Instruments Inc.) was used to perform reverse pole figure orientation mapping of the surface of the film composed of the Ga oxide in a field of view of 500 μm×500 μm. The conditions for this EBSD measurement were as follows.

<EBSD Measurement Conditions>
 Acceleration voltage: 15 kV
 Spot intensity: 70
 Working distance: 22.5 mm
 Step size: 0.5 μm
 Sample tilt angle: 70°
 Measurement program: Aztec (version 3.3)

From the obtained reverse pole figure orientation mapping, it was found that the Ga oxide film has a biaxially oriented corundum-type crystal structure in which the Ga oxide film was c-axis oriented in the substrate normal direction. However, a domain shifted by 60° was observed in the in-plane direction. From these, it was shown that a uniaxial orientation film composed of α-Ga$_2$O$_3$ was formed.

(4c) Plane TEM of Film Forming Side Surface

Plane TEM observation (plan view) was performed to evaluate the crystal defect density of the α-Ga$_2$O$_3$ film. The test piece was cut out so as to include the surface on the film formation side, and processed by ion milling so that the sample thickness (T) around the measurement field of view was 150 nm. The obtained sections were subjected to TEM observation at an acceleration voltage of 300 kV using a transmission electron microscope (H-90001UHR-I manufactured by Hitachi) to evaluate the crystal defect density. Actually, eight TEM images having a measurement field of view of 4.1 μm×3.1 μm were observed. As a result, a large number of crystal defects were observed in the obtained TEM images, and the crystal defect density was found to be at least $1.0 \times 10^{11}/cm^2$ or more.

(4d) XRD (Rotation Domain)

In order to evaluate the degree of rotation domain content of the α-Ga$_2$O$_3$ film, in the same manner as in Example 1 (4g), φ scan was performed on the (104) plane of α-Ga$_2$O$_3$ on the surface of the α-Ga$_2$O$_3$ film. As a result, a sub-peak caused by the rotation domain was detected, and the proportion of the peak intensity of the sub-peak to the peak intensity of the main peak was 5.4%.

What is claimed is:

1. A base substrate comprising an orientation layer used for crystal growth of a nitride or oxide of a Group 13 element,
   wherein a front surface of the orientation layer on a side used for the crystal growth is composed of a material having a corundum-type crystal structure having an a-axis length and/or c-axis length larger than that of sapphire,
   wherein the orientation layer contains a material selected from the group consisting of α-Cr$_2$O$_3$, α-Fe$_2$O$_3$, α-Ti$_2$O$_3$, α-V$_2$O$_3$, and α-Rh$_2$O$_3$, or a solid solution containing two or more selected from the group consisting of α-Al$_2$O$_3$, α-Cr$_2$O$_3$, α-Fe$_2$O$_3$, α-Ti$_2$O$_3$, α-V$_2$O$_3$, and α-Rh$_2$O$_3$, and
   wherein a half width of an X-ray rocking curve of a (104) plane of the corundum-type crystal structure on the front surface of the orientation layer on the side used for crystal growth is 500 arcsec. or less.

2. The base substrate according to claim 1, wherein a half width of an X-ray rocking curve of a (006) plane of the corundum-type crystal structure on the front surface of the orientation layer on the side used for crystal growth is 100 arcsec. or less.

3. The base substrate according to claim 1, wherein when an X-ray diffraction (XRD) φ scan measurement is performed on the (104) plane of the corundum-type crystal structure on the front surface of the orientation layer on the side used for crystal growth, a proportion of a peak intensity of a sub-peak caused by a rotation domain to a peak intensity of a main peak is 5.0% or less.

4. The base substrate according to claim 1, wherein a half width of an X-ray rocking curve of a (006) plane of the corundum-type crystal structure on the front surface of the orientation layer on the side used for crystal growth is 50 arcsec. or less.

5. The base substrate according to claim 1, wherein a crystal defect density of the front surface of the orientation layer on the side used for crystal growth is $1\times10^6/cm^2$ or less.

6. The base substrate according to claim 1, wherein the base substrate is used for crystal growth of a semiconductor layer composed of $\alpha\text{-}Ga_2O_3$ or an $\alpha\text{-}Ga_2O_3$ solid solution, and the orientation layer is composed of a material containing $\alpha\text{-}Cr_2O_3$ or a material containing a solid solution of $\alpha\text{-}Cr_2O_3$ and a different material.

7. The base substrate according to claim 1, wherein a value of the a-axis length and/or c-axis length of the orientation layer on the front surface of the orientation layer is larger than a value of an a-axis length and/or c-axis length on a rear surface of the orientation layer by 4.0% or more.

8. The base substrate according to claim 1, wherein the material having the corundum-type crystal structure contains one or more materials selected from the group consisting of $\alpha\text{-}Cr_2O_3$, $\alpha\text{-}Fe_2O_3$, and $\alpha\text{-}Ti_2O_3$ or solid solutions thereof, or a solid solution containing $\alpha\text{-}Al_2O_3$ and one or more selected from the group consisting of $\alpha\text{-}Cr_2O_3$, $\alpha\text{-}Fe_2O_3$, and $\alpha\text{-}Ti_2O_3$.

9. The base substrate according to claim 1, wherein an entirety of the orientation layer is composed of the material having the corundum-type crystal structure.

10. The base substrate according to claim 1, wherein the a-axis length of the material having the corundum-type crystal structure on the front surface is larger than 4.754 Å and 5.157 Å or less.

11. The base substrate according to claim 10, wherein the a-axis length is 4.850 to 5.000 Å.

12. The base substrate according to claim 1, wherein a gradient composition region having a composition varying in a thickness direction is present in the orientation layer.

13. The base substrate according to claim 1, wherein the orientation layer has a composition stable region located near the front surface and having a composition stable in a thickness direction, and a gradient composition region located far from the front surface and having a composition varying in the thickness direction.

14. The base substrate according to claim 12, wherein the gradient composition region is composed of a solid solution containing $\alpha\text{-}Cr_2O_3$ and $\alpha\text{-}Al_2O_3$.

15. The base substrate according to claim 12, wherein in the gradient composition region, an Al concentration decreases in the thickness direction toward the composition stable region.

16. The base substrate according to claim 1, wherein the orientation layer is a heteroepitaxial growth layer.

17. The base substrate according to claim 1, further comprising a support substrate on a side opposite to the front surface of the orientation layer.

18. The base substrate according to claim 17, wherein the support substrate is a sapphire substrate.

19. The base substrate according to claim 1, wherein the orientation layer is a heteroepitaxial growth layer of a sapphire substrate.

20. A method for producing the base substrate according to claim 1, comprising:
providing a sapphire substrate;
forming an orientation precursor layer on a surface of the sapphire substrate, wherein the orientation precursor layer contains a material having a corundum-type crystal structure having an a-axis length and/or c-axis length larger than that of sapphire, or a material capable of having a corundum-type crystal structure having an a-axis length and/or c-axis length larger than that of sapphire by heat treatment; and
heat-treating the sapphire substrate and the orientation precursor layer at a temperature of 1000° C. or greater.

* * * * *